US012622232B2

(12) United States Patent
Singhal et al.

(10) Patent No.: US 12,622,232 B2
(45) Date of Patent: May 5, 2026

(54) ADVANCED SELF ALIGNED MULTIPLE PATTERNING USING TIN OXIDE

(71) Applicant: Lam Research Corporation, Fremont, CA (US)

(72) Inventors: Akhil Singhal, Beaverton, OR (US); Sivananda Krishnan Kanakasabapathy, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 509 days.

(21) Appl. No.: 18/002,627

(22) PCT Filed: Jul. 21, 2021

(86) PCT No.: PCT/US2021/042626
§ 371 (c)(1),
(2) Date: Dec. 20, 2022

(87) PCT Pub. No.: WO2022/020507
PCT Pub. Date: Jan. 27, 2022

(65) Prior Publication Data

US 2023/0238238 A1 Jul. 27, 2023

Related U.S. Application Data

(60) Provisional application No. 62/705,952, filed on Jul. 23, 2020.

(51) Int. Cl.

| | |
|---|---|
| ***H01L 21/02*** | (2006.01) |
| ***H01L 21/033*** | (2006.01) |
| ***H01L 21/768*** | (2006.01) |

(52) U.S. Cl.
CPC .... *H01L 21/0337* (2013.01); *H01L 21/02181* (2013.01); *H01L 21/02186* (2013.01); *H01L 21/0228* (2013.01); *H01L 21/76897* (2013.01)

(58) Field of Classification Search
None
See application file for complete search history.

(56) References Cited

U.S. PATENT DOCUMENTS 4,544,444 A 10/1985 Chang
4,708,766 A 11/1987 Hynecek
(Continued)

FOREIGN PATENT DOCUMENTS

CN 1213708 A 4/1999
CN 1959541 A 5/2007
(Continued)

OTHER PUBLICATIONS

Bespalov I., et al., "Key Role of Very Low Energy Electrons in Tin-Based Molecular Resists for Extreme Ultraviolet Nanolithography," ACS Applied Materials & Interfaces, 2020, vol. 12, pp. 9881-9889.
(Continued)

*Primary Examiner* — Asok K Sarkar
(74) *Attorney, Agent, or Firm* — Weaver Austin Villeneuve & Sampson LLP

(57) ABSTRACT

Disclosed are methods and apparatuses for performing spacer on spacer multiple patterning schemes using an exhumable first spacer material and a complementary second spacer material. Certain embodiments involve using a tin oxide spacer material for one of the spacer materials in spacer on spacer self aligned multiple patterning.

19 Claims, 9 Drawing Sheets

(56) References Cited

U.S. PATENT DOCUMENTS

| | | | |
|---|---|---|---|
| 4,750,980 | A | 6/1988 | Hynecek |
| 4,778,562 | A | 10/1988 | Chang |
| 4,878,993 | A | 11/1989 | Rossi et al. |
| 5,032,221 | A | 7/1991 | Roselle et al. |
| 5,079,178 | A | 1/1992 | Chouan et al. |
| 5,171,401 | A | 12/1992 | Roselle |
| 5,286,337 | A | 2/1994 | Tsou |
| 5,318,664 | A | 6/1994 | Saia et al. |
| 5,399,464 | A | 3/1995 | Lee |
| 5,607,602 | A | 3/1997 | Su et al. |
| 5,667,631 | A | 9/1997 | Holland et al. |
| 5,723,366 | A | 3/1998 | Suzuki et al. |
| 6,036,876 | A | 3/2000 | Chen et al. |
| 6,083,844 | A | 7/2000 | Bui-Le et al. |
| 6,180,438 | B1 | 1/2001 | Deane et al. |
| 6,326,301 | B1 | 12/2001 | Venkatesan et al. |
| 6,368,978 | B1 | 4/2002 | Kumar et al. |
| 6,416,822 | B1 | 7/2002 | Chiang et al. |
| 6,428,859 | B1 | 8/2002 | Chiang et al. |
| 6,617,253 | B1 | 9/2003 | Chu et al. |
| 6,833,306 | B2 | 12/2004 | Lyding et al. |
| 7,459,732 | B2 | 12/2008 | Fleischer et al. |
| 8,163,094 | B1 | 4/2012 | Greer et al. |
| 8,435,608 | B1 | 5/2013 | Subramonium et al. |
| 8,747,964 | B2 | 6/2014 | Park et al. |
| 8,901,016 | B2 | 12/2014 | Ha et al. |
| 8,969,110 | B2 | 3/2015 | Choi |
| 9,269,590 | B2 | 2/2016 | Luere et al. |
| 9,287,113 | B2 | 3/2016 | Kang et al. |
| 9,390,909 | B2 | 7/2016 | Pasquale et al. |
| 9,437,443 | B2 | 9/2016 | Brink et al. |
| 9,515,156 | B2 | 12/2016 | Besser et al. |
| 9,523,148 | B1 | 12/2016 | Pore et al. |
| 9,640,396 | B2 | 5/2017 | Lin et al. |
| 9,824,893 | B1 | 11/2017 | Smith et al. |
| 9,892,917 | B2 | 2/2018 | Swaminathan et al. |
| 9,996,004 | B2 | 6/2018 | Smith et al. |
| 10,546,748 | B2 | 1/2020 | Yu et al. |
| 10,665,501 | B2 | 5/2020 | Rainville et al. |
| 10,672,913 | B2 | 6/2020 | Yamazaki et al. |
| 10,732,505 | B1 | 8/2020 | Meyers et al. |
| 11,031,245 | B2 | 6/2021 | Smith et al. |
| 11,088,019 | B2 | 8/2021 | Van Cleemput et al. |
| 11,183,383 | B2 | 11/2021 | Smith et al. |
| 11,322,351 | B2 | 5/2022 | Yu et al. |
| 11,355,353 | B2 | 6/2022 | Yu et al. |
| 11,358,975 | B2 | 6/2022 | Ermert et al. |
| 11,551,038 | B2 | 1/2023 | Chaudhuri et al. |
| 11,551,938 | B2 | 1/2023 | Heo et al. |
| 11,637,037 | B2 | 4/2023 | Van Cleemput et al. |
| 11,784,047 | B2 | 10/2023 | Smith et al. |
| 11,848,212 | B2 | 12/2023 | Heo et al. |
| 11,987,876 | B2 | 5/2024 | Kanakasabapathy et al. |
| 12,051,589 | B2 | 7/2024 | Smith et al. |
| 12,094,711 | B2 | 9/2024 | Yu et al. |
| 12,112,980 | B2 | 10/2024 | Van Cleemput et al. |
| 12,183,589 | B2 | 12/2024 | Yu et al. |
| 12,293,919 | B2 | 5/2025 | Heo et al. |
| 12,417,916 | B2 | 9/2025 | Yu et al. |
| 2001/0008227 | A1 | 7/2001 | Sadamoto et al. |
| 2001/0018252 | A1 | 8/2001 | Park et al. |
| 2001/0030860 | A1 | 10/2001 | Kimura et al. |
| 2002/0044230 | A1 | 4/2002 | Yamazaki et al. |
| 2002/0113271 | A1 | 8/2002 | Noguchi et al. |
| 2002/0134425 | A1 | 9/2002 | Yamamoto et al. |
| 2002/0185466 | A1 | 12/2002 | Furuta et al. |
| 2003/0232504 | A1 | 12/2003 | Eppler et al. |
| 2004/0033698 | A1 | 2/2004 | Lee et al. |
| 2005/0112881 | A1 | 5/2005 | Prakash et al. |
| 2005/0153505 | A1 | 7/2005 | Gambino et al. |
| 2005/0167050 | A1 | 8/2005 | Oikawa |
| 2006/0046200 | A1 | 3/2006 | Abatchev et al. |
| 2006/0072084 | A1 | 4/2006 | Van Herpen et al. |
| 2006/0073706 | A1 | 4/2006 | Li et al. |
| 2006/0148118 | A1 | 7/2006 | Hsiung et al. |
| 2006/0175558 | A1 | 8/2006 | Bakker et al. |
| 2006/0270209 | A1 | 11/2006 | Mitsui et al. |
| 2007/0040999 | A1 | 2/2007 | Wilhelmus Van Herpen et al. |
| 2007/0062557 | A1 | 3/2007 | Rakhimova et al. |
| 2007/0069160 | A1 | 3/2007 | Banine et al. |
| 2007/0134938 | A1 | 6/2007 | Kozuka et al. |
| 2008/0061030 | A1 | 3/2008 | Liu et al. |
| 2008/0081483 | A1 | 4/2008 | Wu |
| 2008/0210660 | A1 | 9/2008 | Stockum et al. |
| 2008/0286448 | A1 | 11/2008 | Elam et al. |
| 2008/0286964 | A1 | 11/2008 | Hotta et al. |
| 2009/0011589 | A1 | 1/2009 | Jeon et al. |
| 2009/0017616 | A1 | 1/2009 | Grunow et al. |
| 2009/0145879 | A1 | 6/2009 | Fairbairn et al. |
| 2009/0233425 | A1 | 9/2009 | Furuno et al. |
| 2010/0099046 | A1 | 4/2010 | Kim et al. |
| 2010/0120247 | A1 | 5/2010 | Park |
| 2010/0159639 | A1 | 6/2010 | Sakata |
| 2010/0195033 | A1 | 8/2010 | Takayama et al. |
| 2011/0121378 | A1 | 5/2011 | Ahn et al. |
| 2011/0198627 | A1 | 8/2011 | Maindron et al. |
| 2011/0306214 | A1 | 12/2011 | Zin |
| 2012/0027937 | A1 | 2/2012 | Gordon et al. |
| 2012/0046421 | A1 | 2/2012 | Darling et al. |
| 2012/0115250 | A1 | 5/2012 | Ariga et al. |
| 2012/0193632 | A1 | 8/2012 | Toriumi |
| 2013/0161625 | A1 | 6/2013 | Ku et al. |
| 2013/0273733 | A1 | 10/2013 | Tang et al. |
| 2013/0309871 | A1 | 11/2013 | DeVilliers |
| 2014/0004707 | A1 | 1/2014 | Thedjoisworo et al. |
| 2014/0060574 | A1 | 3/2014 | Wyse et al. |
| 2014/0167040 | A1 | 6/2014 | Lee et al. |
| 2014/0308812 | A1 | 10/2014 | Arghavani et al. |
| 2014/0367833 | A1 | 12/2014 | Brink et al. |
| 2015/0000737 | A1 | 1/2015 | Miyake et al. |
| 2015/0087151 | A1 | 3/2015 | Huang et al. |
| 2015/0122497 | A1 | 5/2015 | Donaldson |
| 2015/0126042 | A1 | 5/2015 | Pasquale et al. |
| 2015/0140726 | A1 | 5/2015 | Honda et al. |
| 2015/0162416 | A1 | 6/2015 | Chang et al. |
| 2015/0179414 | A1 | 6/2015 | Xiao et al. |
| 2015/0214094 | A1 | 7/2015 | Jezewski et al. |
| 2015/0221541 | A1 | 8/2015 | Nemani et al. |
| 2015/0243661 | A1 | 8/2015 | Matsumoto |
| 2015/0247238 | A1 | 9/2015 | Pasquale et al. |
| 2015/0287612 | A1 | 10/2015 | Luere et al. |
| 2015/0318181 | A1 | 11/2015 | Cantone et al. |
| 2016/0111374 | A1 | 4/2016 | Brink et al. |
| 2016/0111515 | A1 | 4/2016 | Besser et al. |
| 2016/0116839 | A1 | 4/2016 | Meyers et al. |
| 2016/0148818 | A1 | 5/2016 | Dobashi et al. |
| 2016/0195812 | A1 | 7/2016 | Huang et al. |
| 2016/0203982 | A1 | 7/2016 | Lin et al. |
| 2016/0216606 | A1 | 7/2016 | Meyers et al. |
| 2016/0293405 | A1 | 10/2016 | Matsumoto et al. |
| 2016/0293418 | A1 | 10/2016 | Pasquale et al. |
| 2016/0293437 | A1 | 10/2016 | Zhou et al. |
| 2016/0293438 | A1 | 10/2016 | Zhou et al. |
| 2016/0314985 | A1 | 10/2016 | Yang et al. |
| 2016/0329207 | A1 | 11/2016 | Mohanty et al. |
| 2016/0336178 | A1* | 11/2016 | Swaminathan ..... H01L 21/0332 |
| 2016/0358782 | A1 | 12/2016 | Yang et al. |
| 2016/0365425 | A1 | 12/2016 | Chen et al. |
| 2016/0379842 | A1 | 12/2016 | Kal et al. |
| 2017/0022607 | A1 | 1/2017 | Shibusawa |
| 2017/0102612 | A1 | 4/2017 | Meyers et al. |
| 2017/0301552 | A1* | 10/2017 | deVilliers ........... H01L 21/0337 |
| 2018/0012759 | A1 | 1/2018 | Smith et al. |
| 2018/0090335 | A1 | 3/2018 | Karve et al. |
| 2018/0204731 | A1 | 7/2018 | Zhang et al. |
| 2018/0233398 | A1 | 8/2018 | Van Cleemput et al. |
| 2018/0240667 | A1 | 8/2018 | Yu et al. |
| 2018/0277661 | A1 | 9/2018 | Nagayama et al. |
| 2018/0308680 | A1 | 10/2018 | Reddy et al. |
| 2019/0027583 | A1 | 1/2019 | Margetis et al. |
| 2019/0137870 | A1 | 5/2019 | Meyers et al. |
| 2019/0157084 | A1 | 5/2019 | Huang et al. |
| 2019/0237341 | A1 | 8/2019 | Yu et al. |
| 2019/0312147 | A1 | 10/2019 | Lee et al. |

(56) References Cited

U.S. PATENT DOCUMENTS

| | | | |
|---|---|---|---|
| 2019/0385828 | A1 | 12/2019 | Singhal et al. |
| 2019/0390341 | A1 | 12/2019 | Singhal et al. |
| 2020/0006082 | A1 | 1/2020 | Su |
| 2020/0051807 | A1 | 2/2020 | Singhal et al. |
| 2020/0083044 | A1 | 3/2020 | Yu et al. |
| 2020/0133131 | A1 | 4/2020 | Ouyang |
| 2020/0199751 | A1 | 6/2020 | Singhal et al. |
| 2020/0219725 | A1 | 7/2020 | Smith et al. |
| 2020/0219758 | A1 | 7/2020 | Van Cleemput et al. |
| 2021/0017643 | A1 | 1/2021 | Kanakasabapathy et al. |
| 2021/0242019 | A1 | 8/2021 | Smith et al. |
| 2021/0265163 | A1 | 8/2021 | Yu et al. |
| 2021/0265173 | A1 | 8/2021 | Yu et al. |
| 2021/0343579 | A1 | 11/2021 | Van Cleemput et al. |
| 2022/0005694 | A1 | 1/2022 | Smith et al. |
| 2022/0021099 | A1 | 1/2022 | Shrivastava et al. |
| 2022/0165571 | A1 | 5/2022 | Yu et al. |
| 2022/0189771 | A1 | 6/2022 | Lee et al. |
| 2022/0189786 | A1 | 6/2022 | Lin et al. |
| 2022/0208551 | A1 | 6/2022 | Heo et al. |
| 2022/0270877 | A1 | 8/2022 | Yu et al. |
| 2023/0197459 | A1 | 6/2023 | Heo et al. |
| 2023/0227970 | A1 | 7/2023 | Ha et al. |
| 2024/0030031 | A1 | 1/2024 | Smith et al. |
| 2024/0087904 | A1 | 3/2024 | Heo et al. |
| 2024/0191350 | A1 | 6/2024 | Chang et al. |
| 2024/0263301 | A1 | 8/2024 | Kanakasabapathy et al. |
| 2024/0302739 | A1 | 9/2024 | Kanakasabapathy et al. |
| 2024/0429091 | A1 | 12/2024 | Van Cleemput et al. |
| 2025/0087498 | A1 | 3/2025 | Yu et al. |

FOREIGN PATENT DOCUMENTS

| | | | |
|---|---|---|---|
| CN | 101512726 | A | 8/2009 |
| CN | 101681812 | A | 3/2010 |
| CN | 103426809 | A | 12/2013 |
| CN | 104701142 | A | 6/2015 |
| CN | 104752199 | A | 7/2015 |
| CN | 107546106 | A | 1/2018 |
| DE | 4337309 | A1 | 3/1995 |
| EP | RD301101 | A | 5/1989 |
| JP | S5330798 | A | 3/1978 |
| JP | S62136579 | A | 6/1987 |
| JP | S62179774 | A | 8/1987 |
| JP | S6425420 | A | 1/1989 |
| JP | H01259184 | A | 10/1989 |
| JP | H0298007 | A | 4/1990 |
| JP | H0377209 | A | 4/1991 |
| JP | H03136249 | A | 6/1991 |
| JP | H04506888 | A | 11/1992 |
| JP | H05267701 | A | 10/1993 |
| JP | H06151379 | A | 5/1994 |
| JP | H0781600 | A | 3/1995 |
| JP | H08162443 | A | 6/1996 |
| JP | H09120967 | A | 5/1997 |
| JP | 2644758 | B2 | 8/1997 |
| JP | H1010549 | A | 1/1998 |
| JP | H1081600 | A | 3/1998 |
| JP | H10303176 | A | 11/1998 |
| JP | H11219941 | A | 8/1999 |
| JP | 2001068462 | A | 3/2001 |
| JP | 2003068155 | A | 3/2003 |
| JP | 2005217240 | A | 8/2005 |
| JP | 2007096297 | A | 4/2007 |
| JP | 2007208076 | A | 8/2007 |
| JP | 2013179127 | A | 9/2013 |
| JP | 2013191762 | A | 9/2013 |
| JP | 2014086500 | A | 5/2014 |
| JP | 2015011668 | A | 1/2015 |
| JP | 2015111668 | A | 6/2015 |
| JP | 2015122497 | A | 7/2015 |
| JP | 2016082233 | A | 5/2016 |
| JP | 2016143890 | A | 8/2016 |
| JP | 2017022368 | A | 1/2017 |
| JP | 2018006742 | A | 1/2018 |
| JP | 2018142698 | A | 9/2018 |
| JP | 2020508579 | A | 3/2020 |
| JP | 2020510994 | A | 4/2020 |
| KR | 950012151 | A | 5/1995 |
| KR | 19990023468 | A | 3/1999 |
| KR | 20030007457 | A | 1/2003 |
| KR | 20040016779 | A | 2/2004 |
| KR | 20070067119 | A | 6/2007 |
| KR | 20070076721 | A | 7/2007 |
| KR | 20090022667 | A | 3/2009 |
| KR | 20120024616 | A | 3/2012 |
| KR | 20120125102 | A | 11/2012 |
| KR | 20130088704 | A | 8/2013 |
| KR | 20150053253 | A | 5/2015 |
| KR | 20160021809 | A | 2/2016 |
| KR | 20160110945 | A | 9/2016 |
| KR | 20170141673 | A | 12/2017 |
| KR | 20180002026 | A | 1/2018 |
| KR | 20210128796 | A | 10/2021 |
| RU | 2053584 | C1 | 1/1996 |
| TW | 134077 | | 5/1990 |
| TW | 328624 | B | 3/1998 |
| TW | 538137 | B | 6/2003 |
| TW | 200531080 | A | 9/2005 |
| TW | 200938660 | A | 9/2009 |
| TW | 201027593 | A | 7/2010 |
| TW | 201410914 | A | 3/2014 |
| TW | 201427084 | A | 7/2014 |
| TW | 201546314 | A | 12/2015 |
| TW | 201626564 | A | 7/2016 |
| TW | 201812834 | A | 4/2018 |
| TW | 202002076 | A | 1/2020 |
| WO | WO-9859379 | A1 | 12/1998 |
| WO | WO-2010134176 | A1 | 11/2010 |
| WO | WO-2014010310 | A1 | 1/2014 |
| WO | WO-2019152362 | A1 | 8/2019 |
| WO | WO-2019199467 | A1 | 10/2019 |
| WO | WO-2019216092 | A1 | 11/2019 |
| WO | WO-2019217749 | A1 | 11/2019 |
| WO | WO-2020005487 | A1 | 1/2020 |
| WO | WO-2020033602 | A1 | 2/2020 |
| WO | WO-2020263757 | A1 | 12/2020 |

OTHER PUBLICATIONS

Cardineau, B et al., "EUV Resists Based on Tin-oxo Clusters", Advances in Patterning Materials and Processes XXXI, Proceedings Of Spie, Apr. 4, 2014, vol. 9051, pp. 335-346.

Chiang C L., et al., "Secondary Electron Emission Characteristics of Oxide Electrodes In Flat Electron Emission Lamp," AIP Advances, 2016, vol. 6, 015317, 9 Pages.

Chinese First Office Action dated Jan. 6, 2020 issued in Application No. CN 201710498301.5.

Chinese Second Office Action dated Jun. 15, 2020 issued in Application No. CN 201710498301.5.

Choi W.S., "The Fabrication of Tin Oxide Films by Atomic Layer Deposition using Tetrakis(Ethylmethylamino) Tin Precursor," Transactions on Electrical and Electronic Materials, Dec. 2009, vol. 10(6), pp. 200-202.

CN Office Action dated Mar. 27, 2023, in Application No. CN201880023914.6 with English translation.

CN Office Action dated Mar. 29, 2023, in Application No. CN201810148464.5 with English translation.

Cui L F., et al., "Endohedral Stannaspherenes M@Sn12: A Rich Class of Stable Molecular Cage Clusters," Endohedral Tin Cages, 2007, vol. 46, pp. 742-745.

Du X., et al., "In Situ Examination of Tin Oxide Atomic Layer Deposition Using Quartz Crystal Microbalance and Fourier Transform Infrared Techniques," Journal of Vacuum Science & Technology, 2005, vol. 23(4), pp. 581-588.

Elam J.W., et al., "Atomic Layer Deposition of Indium Tin Oxide Thin Films Using Nonhalogenated Precursors," Journal of Physical Chemistry C, 2008, vol. 112(6), pp. 1938-1945.

Elam, J.W., et al., "Atomic Layer Deposition of Tin Oxide Films using Tetrakis(Dimethylamino) Tin," Journal of Vacuum Science & Technology, 2008, vol. 26, No. 2, pp. 244-252.

(56) References Cited

OTHER PUBLICATIONS

Fitzgerald C B., et al., "Magnetism in Dilute Magnetic Oxide Thin Films Based on SnO2," The American Physical Society, 2006, vol. 74, 115307, 10 Pages.
Gordon R.G., et al., "Low-Temperature Atmospheric Pressure Chemical Vapor Deposition of Polycrystalline Tin Nitride Thin Films," Chemistry of Materials, 1992, vol. 4, pp. 68-71.
Heo J., et al., "Atomic Layer Deposition of Tin Oxide with Nitric Oxide as an Oxidant Gas," Journals of Materials Chemistry, 2012, vol. 22, pp. 4599-4602.
Heo, J. et al., "Low Temperature Atomic Layer Deposition of Tin Oxide," Chemistry of Materials, 2010, vol. 22, No. 17, pp. 4964-4973.
International Search Report and Written Opinion dated May 18, 2022, in International Application No. PCT/US2022/014984.
International Preliminary Report and Patentability (ISA/KR) dated Oct. 1, 2020 issued in Application No. PCT/US2019/022319.
International Preliminary Report on Patentability dated Aug. 13, 2020 issued in Application No. PCT/US2019/015559.
International Preliminary Report on Patentability dated Aug. 24, 2023, in PCT Application No. PCT/US2022/014984.
International Preliminary Report on Patentability dated Aug. 29, 2019 issued in Application No. PCT/US2018/018019.
International Preliminary Report on Patentability dated Dec. 29, 2022, in PCT Application No. PCT/US2021/036763.
International Preliminary Report on Patentability dated Feb. 2, 2023, in PCT Application No. PCT/US2021/042626.
International Preliminary Report on Patentability dated Jan. 6, 2022 in PCT Application No. PCT/US2020/038996.
International Search Report and Written Opinion dated Nov. 11, 2021, in PCT Application No. PCT/US2021/042626.
International Search Report and Written Opinion dated Oct. 1, 2021, in PCT Application No. PCT/US2021/036763.
International Search Report and Written Opinion dated Oct. 5, 2020, in application No. PCT/US2020/038996.
International Search Report and Written Opinion (ISA/KR) dated Jul. 3, 2019 issued in Application No. PCT/US2019/022319.
International Search Report and Written Opinion (ISA/KR) dated Jun. 27, 2018 issued in Application No. PCT/US18/18019.
International Search Report and Written Opinion (ISA/KR) dated May 17, 2019 issued in Application No. PCT/US2019/015559.
Jalife S., et al., "Noble Gas Endohedral Fullerenes," Chemical Science, 2020, vol. 11, pp. 6642-6652.
Japanese First Office Action dated Aug. 3, 2021 issued in Application No. JP 2017-120945.
Japanese Journal of Applied Physics, vol. 27, No. 9, Sep. 1988, T. Minami et al.: "Reactive ion etching of transparent conducting tin oxide films using electron cyclotron resonance hydrogen plasma", pp. L 1753-L 1756 (Year: 1988).
JP Office Action dated Nov. 1, 2022, in Application No. JP2019-543306 with English translation.
JP Office Action dated Feb. 1, 2022, in Application No. JP2018-021500 with English translation.
JP Office Action dated Jan. 24, 2023 in Application No. JP2020-540611 with English translation.
JP Office Action dated Jul. 18, 2023 in Application No. JP2022-93370 with English Translation.
JP Office Action dated Mar. 29, 2022, in Application No. JP2019-543306 with English translation.
JP Office Action dated May 10, 2022, in Application No. JP2017-120945 with English translation.
JP Office Action dated Sep. 5, 2023, in Application No. JP2022-154384 with English translation.
JP06151379A (translation) (Year: 1994).
Komen C V., et al., "Structure-Magnetic Property Relationship Intransition Metal (M = V,Cr, Mn, Fe, Co, Ni) Doped Sno2 Nanoparticles," Journal of Applied Physics, 2008, vol. 103, 5 Pages.
Korean First Office Action dated Aug. 18, 2021 issued in Application No. KR 10-2017-0077686.
Korean First Office Action dated Jul. 30, 2021 issued in Application No. KR 10-2021-7017077.
KR Office Action dated Aug. 30, 2022 in Application No. KR10-2020-7024840 With English translation.
KR Office Action dated Jul. 18, 2022 in Application No. KR10-2021-7017077 With English translation.
KR Office Action dated Jun. 8, 2022, in Application No. KR1020200034960 with English translation.
KR Office action dated Apr. 20, 2022, in Application No. KR10-2019-7026772 with English translation.
KR Office Action dated Aug. 18, 2021, in application No. KR1020200034960.
KR Office Action dated Feb. 17, 2022, in Application No. KR10-2021-7017077 with English translation.
KR Office Action dated Jan. 30, 2023 in Application No. KR10-2019-7026772 with English translation.
KR Office Action dated Mar. 29, 2022, in Application No. KR1020170077686 with English translation.
KR Office Action dated Mar. 29, 2022, in Application No. KR1020200034960 with English translation.
KR Office Action dated Mar. 30, 2023, in Application No. KR10-2020-7024840 With English translation.
KR Office Action dated Mar. 30, 2023, in Application No. KR10-2022-7032676 with English translation.
KR Office Action dated May 14, 2023, in Application No. KR10-2021-7017290 with English translation.
KR Office Action dated Nov. 20, 2022, in Application No. KR10-2018-0014921 with English translation.
KR Office Action dated Nov. 20, 2022, in Application No. KR10-2020-0034961 with English translation.
KR Office Action dated Nov. 24, 2023 in KR Application No. KR10-2018-0014921.
KR Office Action dated Nov. 24, 2023 in KR Application No. KR10-2020-0034961.
KR Office Action dated Sep. 18, 2023, in Application No. KR10-2022-7003106 with English translation.
Kvon V., et al., "Secondary Electron Emission Of Tin And Tin-Lithium Under Low Energy Helium Plasma Exposure," Nuclear Materials and Energy, 2017, vol. 13, pp. 21-27.
Kwon K.H., et al., "Etch Mechanism of $In_2O_3$ and $SnO_2$ Thin Films in HBr-Based Inductively Coupled Plasmas," Journal of Vacuum Science and Technology A, 2010, vol. 28(2), pp. 226-231.
Li X., et al., "Tin Oxide with Controlled Morphology and Crystallinity by Atomic Layer Deposition onto Graphene Nanosheets for Enhanced Lithium Storage," Advanced Function Materials, 2012, vol. 22, pp. 1647-1654.
Lin Y., et al., "A New Examination Of Secondary Electron Yield Data," Surface And Interface Analysis, 2005, vol. 37, pp. 895-900.
Mohri M., et al., "Plasma Etching of ITO Thin Films Using a CH4/H2 Gas Mixture," Japanese Journal of Applied Physics, 1990, vol. 29(10), pp. 1932-1935.
Mullings M.N., et al., "Tin Oxide Atomic Layer Deposition from Tetrakis(Dimethylamino)Tin and Water," Journal of Vacuum Science & Technology A, 2013, vol. 31(6), 8 pages.
Notice of Allowance dated Nov. 16, 2021, in U.S. Appl. No. 16/687,142.
Notice of Allowance dated Oct. 27, 2021, in U.S. Appl. No. 16/825,514.
Ogale S B., et al., "High Temperature Ferromagnetism with Giant Magnetic Moment in Transparent Co-doped SnO2-δ," Physical Review Letters, 2003, 17 Pages.
Pedersen A., et al., "Lithiation of Tin Oxide: A Computational Study," Integrated Systems Laboratory, 2014, 20 Pages.
Saunders M., et al., "Noble Gas Atoms Inside Fullerenes," Science, 1996, vol. 271, pp. 1693-1697.
Singh R ., "Unexpected Magnetism In Nanomaterials," Journal of Magnetism and Magnetic Materials, 2013, vol. 346, pp. 58-73.
Taiwanese First Office Action dated Dec. 2, 2020 issued in Application No. TW 106121182.
Taiwanese First Office Action dated Jun. 17, 2021 issued in Application No. TW 107104861.
Taiwanese Second Office Action dated Jul. 20, 2021 issued in Application No. TW 106121182.

(56) References Cited

OTHER PUBLICATIONS

Tian Y F., et al., "Oxide Magnetic Semiconductors: Materials, Properties, And Devices," Magnetism, Magnetic Materials, And Interdisciplinary Research, 2013, vol. 22(8), 2 Pages.
TW Office Action dated Dec. 30, 2021, in application No. 110121421 with English translation.
TW Office Action dated Nov. 17, 2022, in Application No. TW107104861 with English Translation.
TW Office Action dated Apr. 27, 2022, in Application No. TW107105182 with English translation.
TW Office Action dated Aug. 27, 2021, in Application No. TW110121421 with English translation.
TW Office Action dated Mar. 2, 2023, in Application No. 110121421 with English translation.
TW Office Action dated Mar. 2, 2023, in Application No. TW107105182 with English translation.
TW Office Action dated Mar. 20, 2023, in Application No. TW107105182 with English translation.
TW Office Action dated Nov. 15, 2023, in application No. TW112117869.
TW Office Action dated Oct. 31, 2023, in TW Application No. TW109121292 with English Translation.
TW Office Action dated Sep. 23, 2022 In Application No. TW111123354 with English translation.
TW Office Action dated Sep. 7, 2021, in TW Application No. TW107105182 with English translation.
TW Rejection Decision dated Oct. 21, 2021, in application No. TW107104861 with English translation.
US Corrected Notice of Allowability dated Dec. 1, 2021, in application No. 16/687,142.
U.S. Corrected Notice of Allowance dated Feb. 16, 2022 in U.S. Appl. No. 16/260,764.
U.S. Corrected Notice of Allowance dated Feb. 22, 2022 in U.S. Appl. No. 16/687,142.
U.S. Corrected Notice of Allowance dated Mar. 17, 2022 in U.S. Appl. No. 16/687,142.
U.S. Corrected Notice of Allowance dated May 6, 2022 in U.S. Appl. No. 16/260,764.
U.S. Corrected Notice of Allowance dated Nov. 25, 2022 in U.S. Appl. No. 17/596,921.
US Final Office Action, dated Apr. 16, 2020, issued in U.S. Appl. No. 15/713,377.
US Final Office Action, dated Dec. 15, 2020, issued in U.S. Appl. No. 15/893,458.
US Final Office Action, dated Dec. 7, 2020 issued in U.S. Appl. No. 16/260,764.
U.S. Final Office Action dated Feb. 17, 2022 in U.S. Appl. No. 16/825,473.
US Final Office Action, dated Mar. 19, 2020, issued in U.S. Appl. No. 15/893,458.
U.S. Final Office Action dated Oct. 23, 2023 in U.S. Appl. No. 17/302,847.
U.S. Non Final Office Action dated Aug. 15, 2022 in U.S. Appl. No. 17/302,044.
U.S. Non-Final Office Action dated Feb. 13, 2023 in U.S. Appl. No. 17/302,847.
U.S. Non-Final Office Action dated May 5, 2023 in U.S. Appl. No. 18/056,468.
U.S. Non-Final Office Action dated Oct. 3, 2023, in U.S. Appl. No. 17/650,550.
U.S. Non-Final Office Action dated Sep. 7, 2023, in U.S. Appl. No. 16/982,489.
U.S. Non-Final Office Action dated Sep. 22, 2023, in U.S. Appl. No. 17/302,850.
US Notice of Allowance dated Apr. 2, 2021 issued in U.S. Appl. No. 15/893,458.
U.S. Notice of Allowance dated Apr. 4, 2022, in U.S. Appl. No. 16/687,142.
U.S. Notice of Allowance dated Aug. 14, 2023, in U.S. Appl. No. 18/056,468.
US Notice of Allowance, dated Aug. 21, 2019, issued in U.S. Appl. No. 15/894,635.
U.S. Notice of Allowance dated Aug. 23, 2022 in U.S. Appl. No. 17/596,921.
U.S. Notice of Allowance dated Dec. 14, 2022 in U.S. Appl. No. 16/825,473.
U.S. Notice of Allowance dated Feb. 2, 2022 in U.S. Appl. No. 16/260,764.
U.S. Notice of Allowance dated Feb. 27, 2023 in U.S. Appl. No. 16/825,473.
US Notice of Allowance dated Jan. 26, 2021 issued in U.S. Appl. No. 15/713,377.
U.S. Notice of Allowance dated Jun. 5, 2023, in U.S. Appl. No. 17/302,044.
US Notice of Allowance dated Jun. 23, 2021 issued in U.S. Appl. No. 16/825,514.
US Notice of Allowance, dated Jun. 26, 2017, issued in U.S. Appl. No. 15/195,348.
U.S. Notice of Allowance dated Mar. 16, 2023 in U.S. Appl. No. 16/825,473.
U.S. Notice of Allowance dated May 11, 2022, in U.S. Appl. No. 17/596,921.
US Office Action, dated Apr. 11, 2019, issued in U.S. Appl. No. 15/894,635.
US Office Action, dated Aug. 3, 2020, issued in U.S. Appl. No. 15/893,458.
US Office Action, dated Dec. 26, 2019, issued in U.S. Appl. No. 15/713,377.
US Office Action, dated Feb. 9, 2017, issued in U.S. Appl. No. 15/195,348.
US Office Action dated Jun. 24, 2021 issued in U.S. Appl. No. 16/825,473.
US Office Action, dated Jun. 25, 2020, issued in U.S. Appl. No. 16/260,764.
US Office Action, dated Mar. 30, 2021, issued in U.S. Appl. No. 16/687,142.
US Office Action dated Oct. 22, 2021 issued in U.S. Appl. No. 16/825,473.
US Office Action, dated Sep. 13, 2019, issued in U.S. Appl. No. 15/893,458.
US Office Action, dated Sep. 14, 2020, issued in U.S. Appl. No. 15/713,377.
US Office Action, dated Sep. 27, 2021 issued in U.S. Appl. No. 16/260,764.
US Office Action Interview Summary, dated Mar. 11, 2021, issued in U.S. Appl. No. 15/893,458.
U.S. Appl. No. 18/264,391, inventors Kanakasabapathy S K, et al., filed Aug. 4, 2023.
U.S. Appl. No. 18/482,197, inventors Smith, et al., filed Oct. 6, 2023.
U.S. Appl. No. 18/505,043, inventors Heo S, et al., filed Nov. 8, 2023.
U.S. Restriction Requirement dated Apr. 14, 2023 in U.S. Appl. No. 17/302,850.
U.S. Restriction Requirement dated Mar. 17, 2022, in U.S. Appl. No. 17/302,044.
U.S. Restriction requirement dated May 25, 2023, in U.S. Appl. No. 17/650,550.
U.S Restriction requirement dated Sep. 26, 2023 in U.S. Appl. No. 17/304,697.
U.S. Supplemental Notice of Allowance dated Dec. 22, 2022 in U.S. Appl. No. 16/825,473.
Wolf S., et al., "Silicon Processing for the VLSI Era," Process Technology, 1986, vol. 1, 16 pages.
Wu B.R., et al., "Texture-Etched $SnO_2$ Glasses Applied to Silicon Thin-Film Solar Cells," Journal of Nanomaterials, 2014, vol. 2014, 9 pages.
CN Office Action dated Jan. 23, 2025 in CN Application No. 202011403430.X, with English Translation.
CN Office Action dated Jun. 4, 2024 in CN Application No. 202010517239.1 with English translation.
CN Office Action dated Jun. 17, 2024 in CN Application No. 202110728563.2, with EnglishTranslation.

(56) References Cited

OTHER PUBLICATIONS

CN Office Action dated Jun. 17, 2024 in CN Application No. 202110746345.1, with English Translation.
CN Office Action dated Jun. 24, 2024 in CN Application No. 201980010832.2 with English translation.
CN Office Action dated Jun. 27, 2024 in CN Application No. 201980020786.4 with English translation.
CN Office Action dated Jun. 28, 2024 in CN Application No. 202011403430.X with English translation.
CN Office Action dated Jun. 28, 2025 in CN Application No. 202110746345.1, with English Translation.
CN Office Action dated Mar. 13, 2024 in CN Application No. 202010909034.8, with EnglishTranslation.
CN Office Action dated Mar. 18, 2025 in CN Application No. 202110746345.1, with English Translation.
CN Office Action dated Mar. 31, 2025 in CN Application No. 201980020786.4, with English Translation.
CN Office Action dated Oct. 17, 2024 in CN Application No. 202010517239.1 with English translation.
International Preliminary Report on Patentability and Written Opinion dated Dec. 26, 2024 in PCT Application No. PCT/US2023/068419.
International Preliminary Reporton Patentability dated Nov. 2, 2023 in Application No. PCT/US2022/025553.
International Search Report and Written Opinion dated Jul. 28, 2022 in Application No. PCT/US2022/025553.
International Search Report and Written Opinion dated Oct. 6, 2023 in PCT Application No. PCT/US2023/068419.
JP Office Action dated Aug. 13, 2024 in JP Application No. 2023-118733 with English translation.
JP Office Action dated Dec. 17, 2024 in JP Application No. 2022-575705, with English Translation.
JP Office Action dated Dec. 19, 2023, in JP Application No. 2022-194568 with English translation.
JP Office Action dated Feb. 12, 2025 in JP Application No. 2023-222187, with English Translation.
JP Office Action dated Jan. 30, 2024 in JP Application No. 2022-154384, with English Translation.
JP Office Action dated Mar. 4, 2025 in JP Application No. 2022-581339, with English Translation.
KR Notice of Allowances dated Jul. 28, 2024, in KR Application No. 10-2018-0014921 with English Translation.
KR Notice of Allowances dated Jul. 28, 2024, in KR Application No. 10-2020-0034961 with English Translation.
KR Office Action dated Dec. 21, 2023 in KR Application No. 10-2020-7029725 with English translation.
KR Office Action dated Jan. 17, 2024 in KR Application No. 10-2023-0062221 with English translation.
KR Office Action dated Nov. 22, 2024 in KR Application No. 10-2024-0147701, with English Translation.
KR Office Action dated Nov. 24, 2023 in KR Application No. 10-2018-0014921 with English Translation.
KR Office Action dated Nov. 24, 2023 in KR Application No. KR10-2020-0034961 with English Translation.
KR Office Action dated Oct. 30, 2024 in KR Application No. 10-2023-0062221, with English Translation.
KR Office Action dated Sep. 27, 2024 in KR Application No. 10-2020-7029725, with English Translation.
TW Office Action dated Jul. 21, 2025 in TW Application No. 110126945, with English Translation.
TW Office Action dated Nov. 11, 2024 in TW Application No. 110126945 with English translation.
TW Office Action dated Nov. 15, 2023, in TW Application No. TW112117869 with English Translation.
TW Office Action dated Nov. 21, 2024 in TW Application No. 110120735, with English Translation.
U.S. Advisory Action dated Jan. 19, 2024 in U.S. Appl. No. 17/302,847.
U.S. Corrected Notice of Allowance dated Jul. 2, 2025 in U.S. Appl. No. 17/650,550.
U.S. Final Office Action dated Apr. 2, 2024 in U.S. Appl. No. 17/302,850.
U.S. Final Office Action dated Dec. 7, 2023 in U.S. Appl. No. 16/982,489.
U.S. Final Office Action dated Jun. 3, 2025 in U.S. Appl. No. 18/482,197.
U.S. Final Office Action dated Mar. 6, 2025 in U.S. Appl. No. 17/302,850.
U.S. Final Office Action dated May 1, 2025 in U.S. Appl. No. 18/001,590.
U.S. Final Office Action dated May 16, 2024 in U.S. Appl. No. 17/650,550.
U.S. Final Office Action dated Oct. 18, 2024 in U.S. Appl. No. 18/505,043.
U.S. Final Office Action dated Sep. 10, 2025 in U.S. Appl. No. 18/634,426.
U.S. Non-Final Office Action dated Dec. 5, 2024 in U.S. Appl. No. 17/650,550.
U.S. Non-Final Office Action dated Dec. 11, 2023 in U.S. Appl. No. 17/448,284.
U.S. Non-Final Office Action dated Feb. 1, 2024 in U.S. Appl. No. 17/302,847.
U.S. Non-Final Office Action dated Jan. 13, 2025 in U.S. Appl. No. 18/001,590.
US Non-Final Office Action dated May 20, 2025 in U.S. Appl. No. 18/634,426.
U.S. Non-Final Office Action dated May 28, 2024 in U.S. Appl. No. 18/505,043.
U.S. Non-Final Office Action dated Sep. 27, 2024 in U.S. Appl. No. 17/302,850.
U.S. Non-Final Office Action dated Sep. 30, 2024 in U.S. Appl. No. 18/482,197.
U.S. Notice of Allowance dated Aug. 18, 2025 in U.S. Appl. No. 18/556,075.
U.S. Notice of Allowance dated Aug. 26, 2024 in U.S. Appl. No. 17/302,847.
U.S. Notice of Allowance dated Feb. 28, 2024 in U.S. Appl. No. 16/982,489.
U.S. Notice of Allowance dated Jan. 8, 2025 in U.S. Appl. No. 18/505,043.
U.S. Notice of Allowance dated Jun. 3, 2024 in U.S. Appl. No. 17/304,697.
U.S. Notice of Allowance dated Jun. 11, 2025 in U.S. Appl. No. 17/650,550.
U.S. Notice of Allowance dated Mar. 26, 2024 in U.S. Appl. No. 16/982,489.
U.S. Notice of Allowance dated Mar. 28, 2024 in U.S. Appl. No. 17/448,284.
U.S. Notice of Allowance dated May 20, 2025 in U.S. Appl. No. 17/302,850.
U.S. Appl. No. 18/869,622, inventors Vrtis R.N et al., filed Nov. 26, 2024.
U.S. Restriction Requirement dated Mar. 28, 2024 in U.S. Appl. No. 17/650,551.
U.S. Restriction Requirement dated Oct. 31, 2024 in U.S. Appl. No. 18/001,590.

* cited by examiner

ADVANCED SELF ALIGNED MULTIPLE PATTERNING USING TIN OXIDE

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

BACKGROUND

Fabrication of advanced integrated circuits often involves patterning of small features in high volume manufacturing of semiconductors. Different patterning techniques may be used to form structures with smaller pitches. Multiple patterning processes such as double patterning and quad patterning can be used to fabricate such structures but increases the number of deposition and etching operations, resulting in increased cost in producing such structures.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

One aspect involves a method for processing substrate, the method including: performing spacer-on-spacer patterning on a semiconductor substrate using at least one spacer including tin oxide.

In various embodiments, performing spacer-on-spacer patterning includes: depositing a first conformal spacer material over a patterned core material, selectively etching the patterned core material to form a first spacer including the first conformal spacer material, depositing a second conformal spacer material over the first spacer, selectively etching the first spacer to form a second spacer including the second conformal spacer material, and etching a target layer using the second spacer as a mask, such that either the first conformal spacer material includes tin oxide or the second conformal spacer material includes tin oxide.

In some embodiments, the spacer-on-spacer patterning is performed to form features having a pitch of less than about 40 nm.

In some embodiments, the tin oxide is deposited using a tin halide, organometallic tin-containing compound, chlorinated organometallic tin-containing compound, and combinations thereof.

In various embodiments, the tin oxide is deposited using a tin-containing precursor such as any one or more of tetrakis(dimethylamino) tin; tetrakis(ethylmethylamino) tin; $N^2$,$N^3$-di-tert-butyl-butane-2,3-diamino-tin(II); and 1,3-bis (1,1-dimethylethyl)-4,5-dimethyl-(4R,5R)-1,3,2-diazastannolidin-2-ylidine.

In some embodiments, the tin-containing precursor is tetrakis(dimethylamino) tin, and the tin oxide is formed by exposing the semiconductor substrate to the tin-containing precursor and an oxygen-containing precursor including oxygen.

In various embodiments, the tin oxide is provided using at least one of chemical vapor deposition process, atomic layer deposition, or any combination thereof.

In various embodiments, tin oxide is provided using plasma-enhanced atomic layer deposition (PEALD).

In various embodiments, the tin oxide is deposited using a tin-containing precursor such as any one or more of to tetrakis(dimethylamino) tin; tetrakis(ethylmethylamino) tin; $N^2$,$N^3$-di-tert-butyl-butane-2,3-diamino-tin(II); 1,3-bis(1,1-dimethylethyl)-4,5-dimethyl-(4R,5R)-1,3,2-diazastannolidin-2-ylidine; stannous fluoride ($SnF_2$); tin(IV) chloride ($SnCl_4$); tin(IV) bromide ($SnBr_4$); tin hydride ($SnH_4$); tin(II) (1,3-bis(1,1-dimethylethyl)-4,5-dimethyl-(4R,5R)-1,3,2-diazastannolidin-2-ylidene); tetraethyl tin ($SnEt_4$); tetramethyl tin ($SnMe_4$); dibutyltin diacetate ($Bu_3Sn(OAC_2)$; (dimethylamino)trimethyl tin(IV) ($Me_3Sn(NMe_2)$); tetrakis(diethylamido)tin(IV) ($Sn(NEt_2)_4$), trimethyl tin chloride; dimethyl tin dichloride; methyl tin trichloride; bis[bis(trimethylsilyl) amino]tin(II); hexaphenylditin(IV); tin(II) acetylacetonate; trimethyl(phenylethynyl)tin; dibutyldiphenyltin; tetraallyltin; tetravinyltin; and tricyclohexyltin hydride.

In some embodiments, the tin oxide is deposited using an oxygen-containing reactant such as any one or more of oxygen gas, oxygen plasma, water, ozone, hydrogen peroxide, and nitrous oxide.

In various embodiments, the first conformal spacer material includes tin oxide and the second conformal spacer material is any one or more of titanium oxide, silicon oxide, silicon nitride, hafnium oxide, and lead oxide.

In various embodiments, the first conformal spacer material is any one or more of titanium oxide, silicon oxide, silicon nitride, and lead oxide and the second conformal spacer material includes tin.

In various embodiments, the first conformal spacer material includes tin oxide and the first spacer is selectively etched by exhuming using hydrogen gas.

Another aspect involves a method for processing substrates, the method including: depositing an exhumable material conformally over a core material; and selectively removing horizontal regions of the exhumable material and removing the core material to form spacers including the exhumable material; and depositing a complementary material over the spacers including the exhumable material, such that the exhumable material is capable of being selectively etched relative to the complementary material.

In various embodiments, the exhumable material includes tin oxide and the complementary material is any one or more of titanium oxide, silicon oxide, silicon nitride, hafnium oxide, and lead oxide.

In various embodiments, the exhumable material is any one or more of titanium oxide, silicon oxide, silicon nitride, and lead oxide and the complementary material includes tin oxide.

In some embodiments, the method also includes removing the spacers including the exhumable material using hydrogen gas.

In various embodiments, the exhumable material includes tin oxide deposited using a tin-containing precursor such as any one or more of tetrakis(dimethylamino) tin; tetrakis (ethylmethylamino) tin; $N^2$,$N^3$-di-tert-butyl-butane-2,3-diamino-tin(II); 1,3-bis(1,1-dimethylethyl)-4,5-dimethyl-(4R,5R)-1,3,2-diazastannolidin-2-ylidine; stannous fluoride ($SnF_2$); tin(IV) chloride ($SnCl_4$); tin(IV) bromide ($SnBr_4$); tin hydride ($SnH_4$); tin(II) (1,3-bis(1,1-dimethylethyl)-4,5-dimethyl-(4R,5R)-1,3,2-diazastannolidin-2-ylidene); tetraethyl tin ($SnEt_4$); tetramethyl tin ($SnMe_4$); dibutyltin diacetate ($Bu_2Sn(OAc)_2$); (dimethylamino)trimethyl tin(IV)

($Me_3Sn(NMe_2)$); tetrakis(diethylamido)tin(IV) ($Sn(NEt_2)_4$), trimethyl tin chloride; dimethyl tin dichloride; methyl tin trichloride; bis[bis(trimethylsilyl)amino]tin(II); hexaphenylditin(IV); tin(II) acetylacetonate; trimethyl(phenylethynyl)tin; dibutyldiphenyltin; tetraallyltin; tetravinyltin; and tricyclohexyltin hydride.

In various embodiments, the tin-containing precursor is tetrakis(dimethylamino) tin, and the exhumable material is deposited by introducing the tin-containing precursor and an oxygen-containing precursor including oxygen.

In some embodiments, one of the exhumable material and complementary material is tin oxide deposited using at least one of chemical vapor deposition process, atomic layer deposition, or any combination thereof.

In various embodiments, one of the exhumable material and complementary material is tin oxide deposited using plasma-enhanced atomic layer deposition (PEALD).

In various embodiments, the exhumable material includes tin oxide deposited using an oxygen-containing reactant such as any one or more of oxygen gas, oxygen plasma, water, ozone, hydrogen peroxide, and nitrous oxide.

Another aspect involves a method for processing substrates, the method including: providing a substrate having a patterned core material; depositing a first material conformally over the patterned core material on sidewalls of the patterned core material, the first material selected from the group consisting of silicon oxide, silicon nitride, titanium oxide, and lead oxide; selectively removing the patterned core material to form a first spacer; depositing a tin oxide spacer material conformally over the first spacer on sidewalls of the first spacer; and selectively removing first spacers to form second spacers including the tin oxide spacer material.

In various embodiments, the tin oxide spacer material is deposited using a tin-containing precursor such as any one or more of tetrakis(dimethylamino) tin; tetrakis(ethylmethylamino) tin; $N^2$,$N^3$-di-tert-butyl-butane-2,3-diamino-tin (II); 1,3-bis(1,1-dimethylethyl)-4,5-dimethyl-(4R,5R)-1,3,2-diazastannolidin-2-ylidine; stannous fluoride ($SnF_2$); tin (IV) chloride ($SnCl_4$); tin(IV) bromide ($SnBr_4$); tin hydride ($SnH_4$); tin(II) (1,3-bis(1,1-dimethylethyl)-4,5-dimethyl-(4R,5R)-1,3,2-diazastannolidin-2-ylidene); tetraethyl tin ($SnEt_4$); tetramethyl tin ($SnMe_4$); dibutyltin diacetate ($Bu_2Sn(OAc)_2$); (dimethylamino)trimethyl tin(IV) ($Me_3Sn(NMe_2)$); tetrakis(diethylamido)tin(IV) ($Sn(NEt_2)_4$), trimethyl tin chloride; dimethyl tin dichloride; methyl tin trichloride; bis[bis(trimethylsilyl)amino]tin(II); hexaphenylditin (IV); tin(II) acetylacetonate; trimethyl(phenylethynyl)tin; dibutyldiphenyltin; tetraallyltin; tetravinyltin; and tricyclohexyltin hydride.

In various embodiments, the tin oxide spacer material is deposited using an oxygen-containing reactant such as any one or more of oxygen gas, oxygen plasma, water, ozone, hydrogen peroxide, and nitrous oxide.

In some embodiments, the patterned core material includes silicon or carbon.

In some embodiments, the first material is any one or more of titanium oxide, silicon oxide, silicon nitride, and lead oxide.

In various embodiments, the first material is selectively removed using a wet etch chemistry.

In various embodiments, the tin-containing precursor is tetrakis(dimethylamino) tin, and the tin oxide spacer material is deposited by exposing the substrate to the tin-containing precursor and an oxygen-containing precursor including oxygen.

In some embodiments, the tin oxide spacer material is deposited using at least one of chemical vapor deposition process, atomic layer deposition, or any combination thereof.

In various embodiments, the tin oxide spacer material is deposited using plasma-enhanced atomic layer deposition (PEALD).

Another aspect involves a method for processing substrates, the method including: providing a substrate having a patterned core material; depositing a tin oxide material conformally over the patterned core material on sidewalls of core material; selectively removing the patterned core material to form tin oxide spacers; depositing a second spacer material conformally over the tin oxide spacers on sidewalls of the tin oxide spacers; and selectively removing the tin oxide spacers to form second spacers.

In various embodiments, the second spacer material is any one or more of titanium oxide, silicon oxide, silicon nitride, hafnium oxide, and lead oxide.

In some embodiments, the tin oxide spacers are selectively removed by exhuming using hydrogen gas.

In some embodiments, the tin oxide material is deposited using a tin-containing precursor such as any one or more of tetrakis(dimethylamino) tin; tetrakis(ethylmethylamino) tin; $N^2$,$N^3$-di-tert-butyl-butane-2,3-diamino-tin(II); 1,3-bis(1,1-dimethylethyl)-4,5-dimethyl-(4R,5R)-1,3,2-diazastannolidin-2-ylidine; stannous fluoride ($SnF_2$); tin(IV) chloride ($SnCl_4$); tin(IV) bromide ($SnBr_4$); tin hydride ($SnH_4$); tin(II) (1,3-bis(1,1-dimethylethyl)-4,5-dimethyl-(4R,5R)-1,3,2-diazastannolidin-2-ylidene); tetraethyl tin ($SnEt_4$); tetramethyl tin ($SnMe_4$); dibutyltin diacetate ($Bu_2Sn(OAC_2)$; (dimethylamino)trimethyl tin(IV) ($Me_3Sn(NMe_2)$); tetrakis(diethylamido)tin(IV) ($Sn(NEt_2)_4$), trimethyl tin chloride; dimethyl tin dichloride; methyl tin trichloride; bis[bis(trimethylsilyl)amino]tin(II); hexaphenylditin(IV); tin(II) acetylacetonate; trimethyl(phenylethynyl)tin; dibutyldiphenyltin; tetraallyltin; tetravinyltin; and tricyclohexyltin hydride.

In various embodiments, the tin oxide material is deposited using an oxygen-containing reactant such as any one or more of oxygen gas, oxygen plasma, water, ozone, hydrogen peroxide, and nitrous oxide.

In some embodiments, the tin-containing precursor is tetrakis(dimethylamino) tin, and the tin oxide material is deposited by exposing the substrate to the tin-containing precursor and an oxygen-containing precursor including oxygen.

In various embodiments, the tin oxide material is provided using at least one of chemical vapor deposition process, atomic layer deposition, or any combination thereof.

In some embodiments, tin oxide is provided using plasma-enhanced atomic layer deposition (PEALD).

Another aspect involves an apparatus for processing a semiconductor substrate including a semiconductor material, the apparatus including: one or more process chambers, where at least one process chamber includes a showerhead, a heated pedestal; a plasma generator capable of generating a plasma within the at least one process chamber; one or more gas sources; one or more gas inlets to deliver gas from the one or more gas sources to the one or more process chambers via the showerhead; a controller having at least one processor and a memory, whereby the at least one processor and the memory are communicatively connected with one another, the at least one processor is at least operatively connected with flow-control hardware, and the memory stores computer-executable instructions for controlling the at least one processor to at least control the flow-control hardware by: causing spacer-on-spacer patterning on a semiconductor substrate using at least one spacer including tin oxide. In various embodiments, instructions for causing spacer-on-spacer patterning includes: instructions for causing deposition of a first conformal spacer material over a patterned core material, causing selectively etching of the patterned core material to form a first spacer including the first conformal spacer material, causing deposition of a second conformal spacer material over the first spacer, causing selectively etching of the first spacer to form a second spacer including the second conformal spacer material, and causing etching of a target layer using the second spacer as a mask, such that either the first conformal spacer material includes tin oxide or the second conformal spacer material includes tin oxide Another aspect involves an apparatus for processing a semiconductor substrate including a semiconductor material, the apparatus including: one or more process chambers, where at least one process chamber includes a showerhead, a heated pedestal; a plasma generator capable of generating a plasma within the at least one process chamber; one or more gas sources; one or more gas inlets to deliver gas from the one or more gas sources to the one or more process chambers via the showerhead; a controller having at least one processor and a memory, whereby the at least one processor and the memory are communicatively connected with one another, the at least one processor is at least operatively connected with flow-control hardware, and the memory stores computer-executable instructions for controlling the at least one processor to at least control the flow-control hardware by: causing deposition of an exhumable material conformally over a core material; and causing selective removal of horizontal regions of the exhumable material and causing removal of the core material to form spacers including the exhumable material; and causing deposition of a complementary material over the spacers including the exhumable material, such that the exhumable material is capable of being selectively etched relative to the complementary material.

Another aspect involves an apparatus for processing a semiconductor substrate including a semiconductor material, the apparatus including: one or more process chambers, where at least one process chamber includes a showerhead, a heated pedestal; a plasma generator capable of generating a plasma within the at least one process chamber; one or more gas sources; one or more gas inlets to deliver gas from the one or more gas sources to the one or more process chambers via the showerhead; a controller having at least one processor and a memory, whereby the at least one processor and the memory are communicatively connected with one another, the at least one processor is at least operatively connected with flow-control hardware, and the memory stores computer-executable instructions for controlling the at least one processor to at least control the flow-control hardware by: causing a substrate having a patterned core material to be provided to one of the one or more process chambers; causing deposition of a first material conformally over the patterned core material on sidewalls of the patterned core material, the first material being any one or more of silicon oxide, silicon nitride, titanium oxide, and lead oxide; causing selective removal of the patterned core material to form a first spacer; causing deposition of a tin oxide spacer material conformally over the first spacer on sidewalls of the first spacer; and causing selective removal of first spacers to form second spacers including the tin oxide spacer material.

Another aspect involves an apparatus for processing a semiconductor substrate including a semiconductor material, the apparatus including: one or more process chambers, where at least one process chamber includes a showerhead, a heated pedestal; a plasma generator capable of generating a plasma within the at least one process chamber; one or more gas sources; one or more gas inlets to deliver gas from the one or more gas sources to the one or more process chambers via the showerhead; a controller having at least one processor and a memory, whereby the at least one processor and the memory are communicatively connected with one another, the at least one processor is at least operatively connected with flow-control hardware, and the memory stores computer-executable instructions for controlling the at least one processor to at least control the flow-control hardware by: causing providing of a substrate having a patterned core material; causing deposition of a tin oxide material conformally over the patterned core material on sidewalls of core material; causing selective removal of the patterned core material to form tin oxide spacers; causing deposition of a second spacer material conformally over the tin oxide spacers on sidewalls of the tin oxide spacers; and causing selective removal of the tin oxide spacers to form second spacers.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor fabrication processes involve patterning schemes that include depositing and etching material to form particular structures within a semiconductor device. Patterning processes that may be used to fabricate structures include double patterning and quad patterning. These are examples of multiple patterning schemes. As patterning processes shift from double patterning to quad patterning processes, the costs of patterning increase due to the increase in number of operations for depositing and etching a semiconductor substrate to achieve desired structures.

Figure 1A:
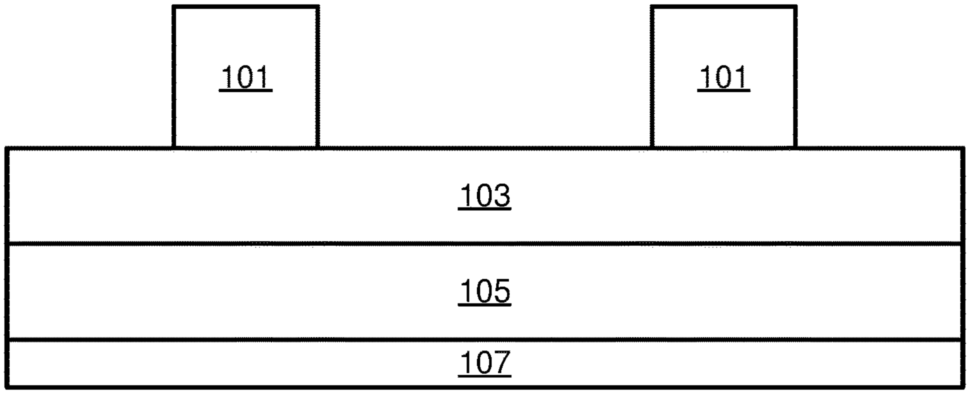
FIGS. 1A-1J are schematic illustrations of substrates in an example of a quad patterning scheme.
Figure 1B:
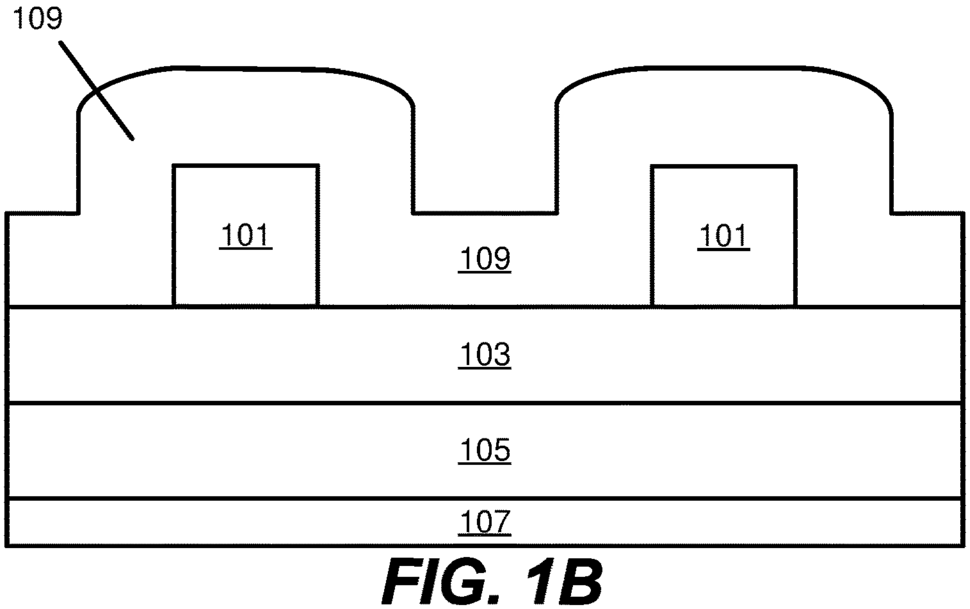
Figure 1C:
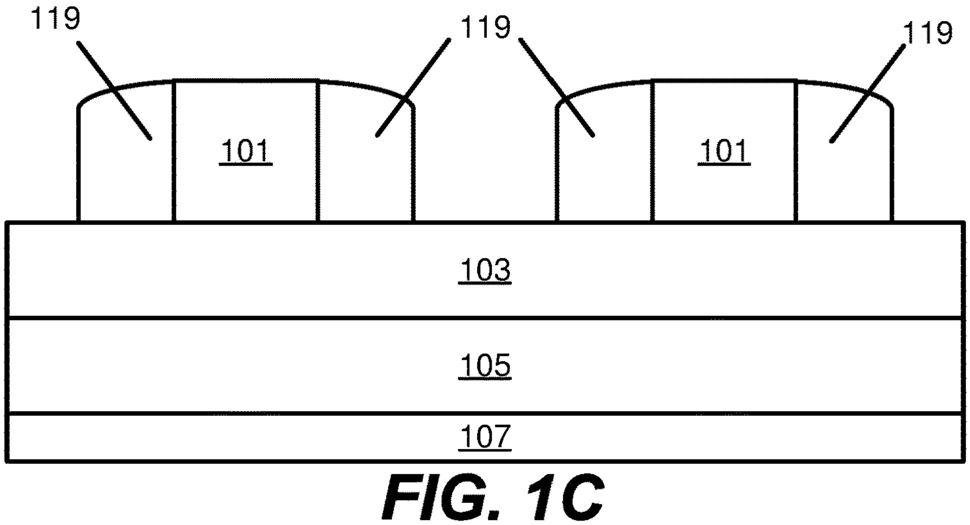
Figure 1D:
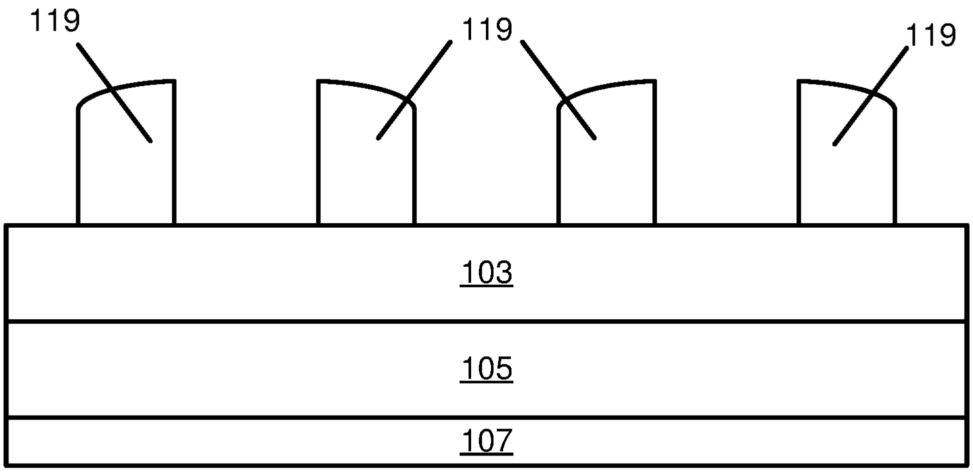

An example of a quad patterning scheme is depicted in FIGS. 1A-1J. In FIG. 1A, a substrate 107 having a target layer 105 is provided with a patterned core 101 and a second core layer 103 underlying the patterned core 101. The patterned core 101 can be patterned using lithography and the features of the patterned core 101 can be referred to as "printed" features. To pattern the target layer 105 with a pattern having smaller pitch, a first pattern is formed by forming first spacer material 109 conformally over the patterned core 101 as shown in FIG. 1B, and removing horizontal regions of the first spacer material 109 to expose the top surface of patterned core 101, which results in first spacers 119 having the spacer material from first spacer material 109 as shown in FIG. 1C. Spacers 119 flank the sidewalls of the patterned core 101 such that removal of horizontal regions of the first spacer material 109 leave two vertical features of spacers 119 for every positive feature of patterned core 101. The patterned core 101 is exhumed in FIG. 1D, leaving first spacers 119 on second core layer 103. This causes the pitch of the first spacers 119 to be half of the printed pitch that was formed from patterning the core material by lithography.

Figure 1E:
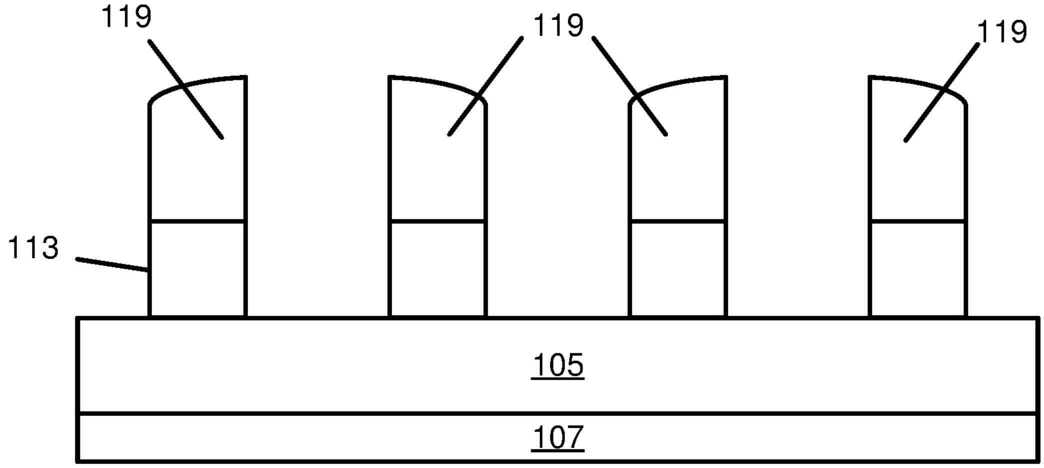
Figure 1F:
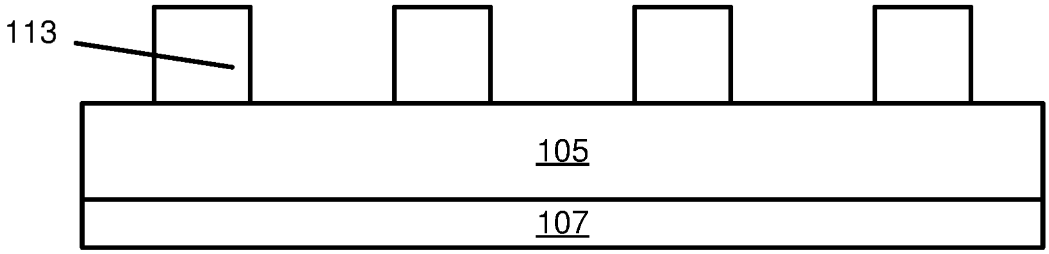
Figure 1G:
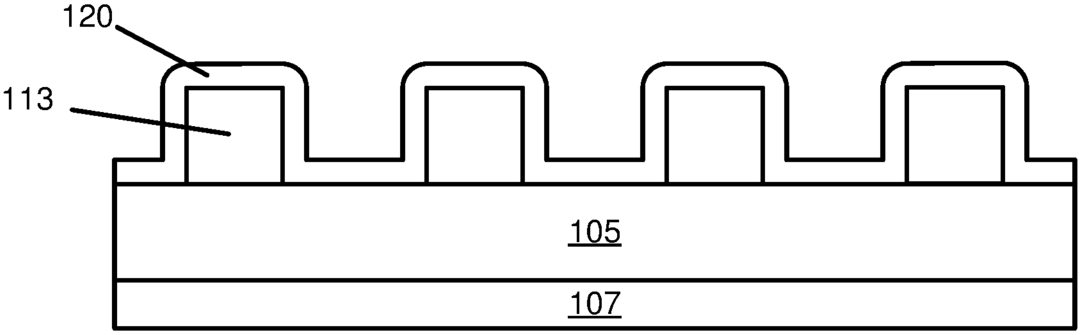
Figure 1H:
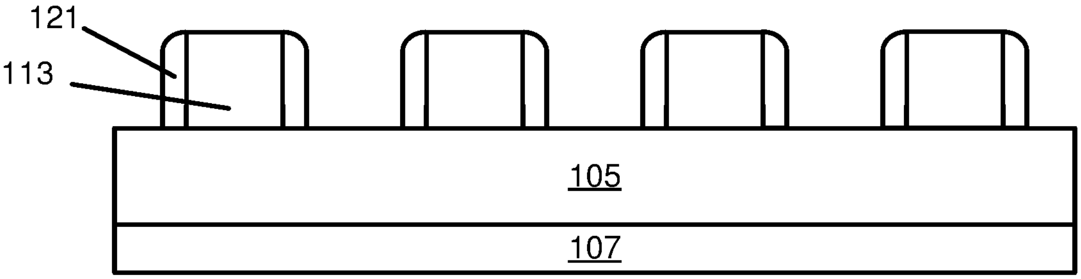
Figure 1I:
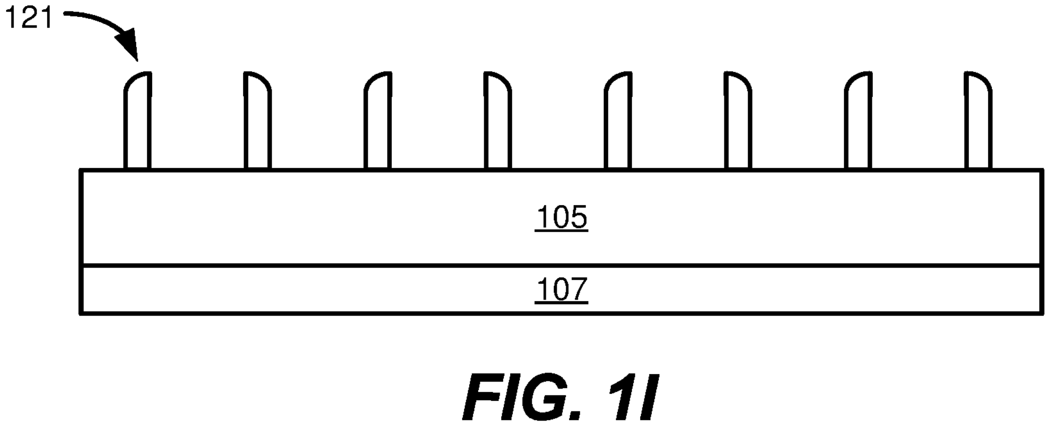
Figure 1J:
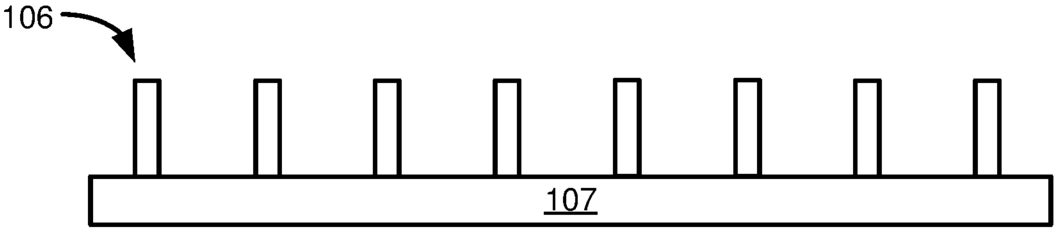

The first spacers 119 are subsequently used as a mask to transfer the half pitch pattern to the second core layer 103 to form second patterned core 113 in FIG. 1E. The first spacers 119 are subsequently removed, leaving the second patterned core 113 over target layer 105 as shown in FIG. 1F. A second spacer material 120 is deposited conformally over the second patterned core 113 to form the structure shown in FIG. 1G. Horizontal regions of the second spacer material 120 are removed to yield second spacers 121 on the sidewalls of second patterned core 113 in FIG. 1H. For each positive feature of the second patterned core 113, there are two second spacers 121, thereby further halving the pitch. In FIG. 1I, second patterned core 113 are removed to leave second spacers 121, resulting in four features for every printed feature in FIG. 1A. The second spacers 121 are then used to etch the target layer 105 as shown in FIG. 1J, resulting in a patterned target layer 106 over substrate 107.

First and second spacers described with respect to FIGS. 1A-1J include silicon-containing materials for self-aligned patterning. For example, silicon oxide ($SiO_2$), which is a low modulus material, is often used as a spacer material. However, as a low modulus material, it can collapse under its own weight if the critical dimension of the spacers are small, such as about 12 nm or less than about 12 nm. Modulus of silicon oxide spacers is about 30 GPa (gigapascals) to about 50 GPa.

As described above, the process scheme in FIGS. 1A-1J involves an operation whereby in FIG. 1E, the first spacer pattern is transferred to a second core. A process results in using both a first and a second core material such that a second core is deposited and a transfer etch process is incorporated into the patterning scheme. To eliminate this operation to reduce the cost of production, several options are available for reducing the cost but may have some trade-offs.

One option for reducing the cost of production is to skip the operation for transferring the first spacer pattern to a second core. This is performed by using materials for the first spacer such that it can become the second core material when it is used to form the first spacer; two different materials can be used for the two sets of spacers, so that the second spacer is subsequently directly deposited conformally on top of features of a first spacer that then act as mandrels. This is referred to as a "spacer-on-spacer" approach. "First" spacer material as described herein refers to the spacer material deposited on patterned core material with larger pitch, and "second" spacer material as described herein refers to the spacer material that is deposited on the first spacer material in spacer on spacer patterning. In various embodiments, "first" spacer material is spacer material deposited on a patterned core material that is lithographically defined or lithographically patterned.

Spacer on spacer patterning eliminates both the operation of transferring the first spacer pattern to the second core and depositing the second core layer in the stack prior to patterning. This reduces cost and improves efficiency and wafer throughput. Eliminating operations also reduces the likelihood of defects being introduced to the wafer during production.

While "spacer on spacer" patterning can be used to reduce cost and enable fabrication of structures with smaller pitch, some materials may be incompatible for performing "spacer on spacer" patterning due to etch selectivity, deposition challenges, etching chemistry challenges, and other issues. For example, deposition of certain spacer materials on patterned core materials can result in degradation of the patterned core during deposition, which affects the critical dimension.

In some spacer-on-spacer patterning schemes, the first spacer material may be silicon. However, when silicon is removed as a mandrel material after the second spacers are formed on either side of silicon cores, silicon cannot be easily removed by exhuming it with hydrogen even though silane is volatile because conversion of silicon to its hydride involves removal at very high temperatures. At such temperatures, the rest of the substrate, which includes silicon, will bend, distort, or even turn into a liquid.

In some spacer-on-spacer patterning schemes, the first spacer material may be titanium oxide. However, it is difficult to achieve selective etching using a dry chlorine-based chemistry and wet etching techniques can cause feature collapse because when small features are etched using a liquid, liquid on the surface of the features have a finite surface tension and wet etchant molecules on narrow structures can cause molecules of the liquid to be adhered to each other, such that when the liquid is removed, too much material may be removed. As a result, solvent-based processes that use non-polar solvents, such as isopropyl alcohol, may be used. However, such processes are not environmentally friendly.

It may be desirable to use a first spacer in a spacer-on-spacer patterning scheme whereby the first spacer is well-scalable. Removal of the first spacer cleanly from the substrate after forming the second spacer using certain silicon-containing materials may be challenging.

Provided herein are methods of performing spacer-on-spacer patterning using an exhumable material as the first spacer material and a complementary material as the second spacer material in spacer-on-spacer patterning. "Exhumable" used herein refers to the ability of being exhumed, such as by a hydrogen-containing gas. Non-limiting examples of "complementary" materials are as follows: silicon oxide is complementary to tin oxide; silicon nitride is complementary to tin oxide; and titanium oxide is complementary to tin oxide.

Certain disclosed embodiments involve methods of implementing spacer material containing heavier Group IV metals than that of silicon such that the spacer material is compatible with organic and inorganic mandrels (such as non-limiting examples of carbon-containing cores and silicon-containing cores, respectively) without causing significant critical dimension variation in self-aligned multiple patterning schemes. Removal of several operations used in quad patterning without affecting critical dimension results in fewer defects and broadening of different materials that can be used for more efficient processes.

Disclosed embodiments implement tin oxide as one of the spacer materials in a spacer-on-spacer patterning scheme. Tin oxide (also referred here to as SnO), as used herein, refers to materials that include tin (Sn) and oxygen (O), and may optionally include hydrogen. Tin oxide, as used herein, may further include small amounts of other elements, such as carbon, and nitrogen, where the total amount of other elements is 10 atomic % or less (where hydrogen is not included in the calculation of the content). For example, SnO deposited by atomic layer deposition (ALD) can contain about 0.5 atomic % carbon to about 5 atomic % carbon. The term "SnO", as used herein, does not indicate the stoichiometry of oxide, which may vary. In some specific embodiments, the stoichiometry of SnO is about 1 tin atom per two oxygen atoms. In some embodiments, SnO refers to tin dioxide.

SnO has greater modulus than that of silicon oxide, thereby being a more robust spacer. The modulus of SnO can be at least about 100 GPa. In one example, the modulus of SnO may be from about 100 GPa to 400 GPa. In another example, the modulus of SnO may be from about 120 GPa to about 300 GPa. As a result, SnO can be implemented for spacers with a critical dimension of down to 6 nm before SnO experiences possibility of collapse. Certain disclosed embodiments are particularly suitable for forming features in a target layer that have pitches of less than about 80 nm or less than about 40 nm as spacers of SnO are robust even at smaller pitches.

The spacer material described herein has unique properties. For example, SnO can be removed using a light element to form volatile materials that selectively etch only SnO. For example, SnO can be exhumed using hydrogen that is selective to all other exposed materials on the substrate thereby forming tin hydride, which is volatile and can be removed easily.

Additionally, certain disclosed materials have the ability to be dry etched in hydrogen while also withstanding high temperature conditions that may be used when depositing metal oxides or nitrides. Because it can withstand such deposition, it is not susceptible to changing critical dimension of features etched in it.

These properties thereby allow SnO to be used as a first spacer material, depositing it on organic or inorganic material, and allowing the SnO to be used as a second spacer by eliminating several operations used in other quad patterning processes.

Tin oxide also has a high deposition rate and can thus be formed more quickly on a patterned core or a first spacer, depending on whether it is implemented as a first spacer material or second spacer material, respectively.

Certain disclosed embodiments involve using SnO as a second spacer material such that other materials can be used for the first spacer material in a spacer-on-spacer patterning scheme. For example, silicon nitride (SiN) can be used as a first spacer on an organic or inorganic core, and the silicon nitride can serve as a core for a second SnO spacer. Since SnO has a low wet etch rate in hot phosphoric acid (H3PO4), silicon nitride can be effectively removed in hot phosphoric acid while maintaining the SnO on the substrate to form second spacers of SnO which are used as a mask to pattern a target layer.

Several other combinations of spacer on spacer materials can be used by implementing certain disclosed embodiments that leverage the unique properties of SnO.

Certain disclosed embodiments involve using an exhumable film for the first conformal spacer material and a complementary film for the second conformal spacer material. Example combinations include the following: the first conformal spacer material is SnO and the second conformal spacer material is silicon oxide; the first conformal spacer material is SnO and the second conformal spacer material is silicon nitride; the first conformal spacer material is SnO and the second conformal spacer material is titanium dioxide; the first conformal spacer material is SnO and the second conformal spacer material is hafnium oxide; and the first conformal spacer material is SnO and the second conformal spacer material is another oxide, or a nitride, or a carbide.

Non-limiting examples are provided below in Table 1:

TABLE 1

Combinations of First Conformal Spacer Material and Second Conformal Spacer Material

| First Conformal Spacer Material | Second Conformal Spacer Material |
|---|---|
| Tin oxide | Silicon oxide, or<br>Silicon nitride, or<br>Titanium oxide, or<br>Hafnium oxide, or<br>Zirconium oxide, or<br>Aluminum oxide, or<br>Lead oxide, or<br>Combinations of the above oxides |
| Silicon oxide, or<br>Silicon nitride, or<br>Titanium oxide, or<br>Lead oxide | Tin oxide |

Figure 2:
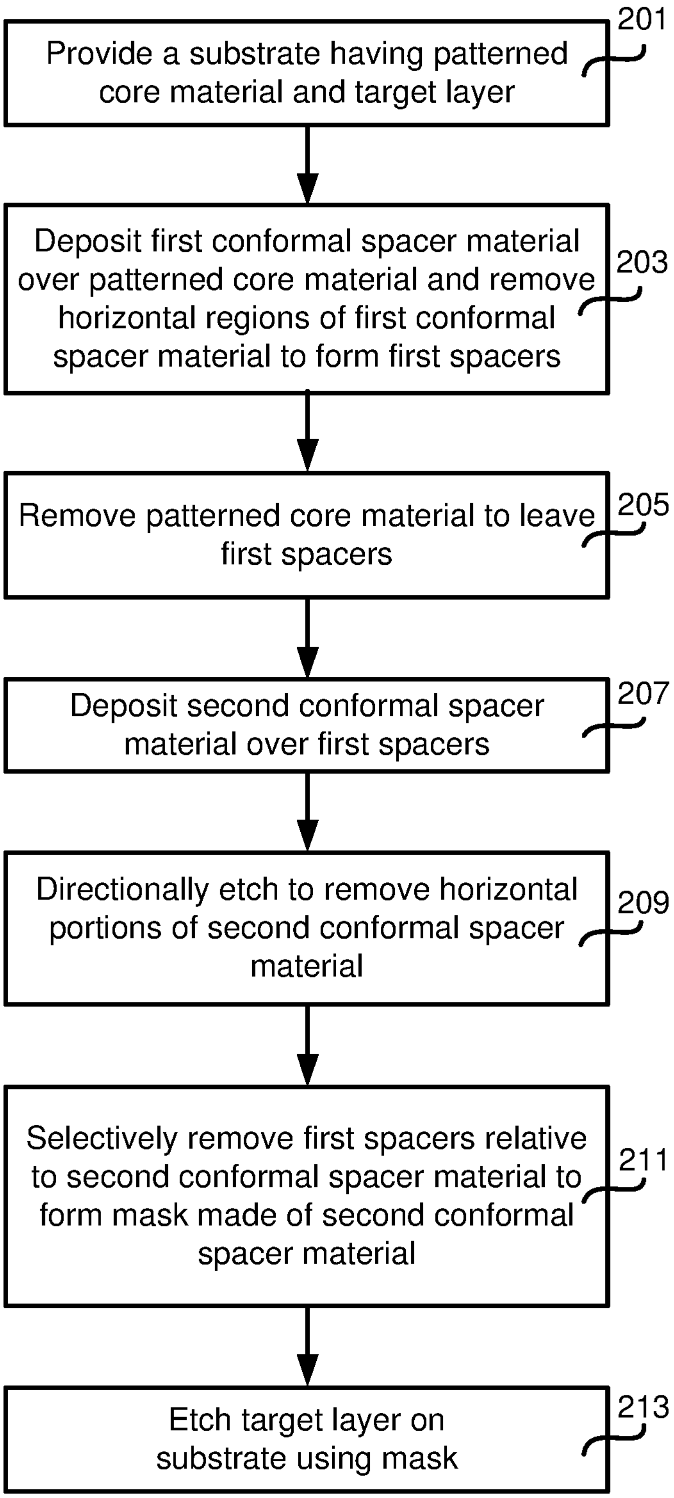
FIG. 2 is a process flow diagram depicting operations for method performed in accordance with certain disclosed embodiments.

FIG. 2 is a process flow diagram that shows various operations that may be performed in accordance with certain disclosed embodiments.

In operation 201, a substrate having at least a core material and target layer is provided. In some embodiments, the patterned core material includes silicon. In some embodiments, the patterned core material includes carbon. The patterned core material may be a photoresist or may be made of amorphous carbon material or amorphous silicon material. In some embodiments, the core material may be transparent. The core material is deposited by a deposition technique, such as plasma enhanced chemical vapor deposition (PECVD), and the deposition technique may involve generating a plasma in a deposition chamber housing the substrate from deposition gases including a hydrocarbon precursor. The hydrocarbon precursor may be defined by the formula $C_aH_b$, where a is an integer between 2 and 10, and b is an integer between 2 and 24. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$). A dual radio frequency (RF) plasma source including a high frequency (HF) power and a low frequency (LF) power may be used. The core material is deposited over a target layer prior to being patterned. The target layer may be the layer ultimately to be patterned. The target layer may be a semiconductor, dielectric, or other layer and may be made of silicon (Si), silicon oxide ($SiO_2$), silicon nitride (SiN), or titanium nitride (TiN), for example. The target layer may be deposited by ALD, plasma-enhanced ALD (PEALD), chemical vapor deposition (CVD), or another suitable deposition technique.

Figure 3A:
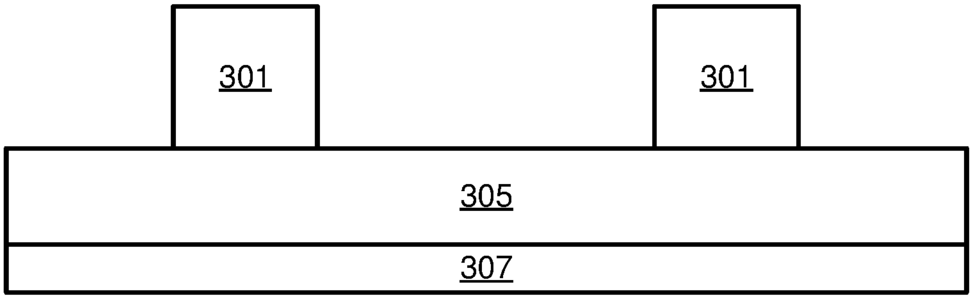
FIG. 3A-3F are schematic illustrations of substrates in an example of a patterning scheme performed in accordance with certain disclosed embodiments.

An example substrate that may be provided in operation 201 is depicted in FIG. 3A. FIG. 3A shows a substrate 307 having a target layer 305 with a patterned core 301. Although FIG. 3A only depicts three layers, it will be understood that in some embodiments, additional layers may be present on the substrate, including but not limited to etch stop layers (such as an etch stop layer between target layer 305 and substrate 307, or an etch stop layer between patterned core 301 and target layer 305, etc.).

Returning to FIG. 2, in operation 203, a first conformal spacer material is deposited over the patterned core material and horizontal regions of the first conformal spacer material are removed to form first spacers including the first conformal spacer material. This operation may be performed at a temperature between about 50° C. and about 200° C. This operation may be performed at a chamber pressure between about 1.0 Torr and about 4.0 Torr. Where a plasma is used, the plasma power may be between about 400 W and about 4000 W for 4 wafers in a chamber. These process conditions may be used to deposit tin oxide as a first conformal spacer or as a second conformal spacer as further described below.

In various embodiments, the first conformal spacer material is SnO. The SnO first conformal spacer material may be deposited using a tin-containing precursor and oxygen-containing reactant and may be deposited using any suitable technique.

The tin-containing precursor may be flowed at a flow rate between about 400 sccm and about 3000 sccm for a chamber with 4 stations for processing 4 wafers. A non-limiting example of a tin-containing precursor is tetrakis(dimethylamido) tin ($Sn(NMe_2)_4$). The oxygen-containing reactant may be oxygen in some embodiments. The oxygen-containing reactant may be flowed at a flow rate between about 400 sccm and about 5000 sccm for a chamber with 4 stations for processing 4 wafers. In some embodiments, an inert gas is flowed. In some embodiments, the inert gas is a carrier gas. Non-limiting examples of inert gases include argon and nitrogen. Argon may be flowed at a flow rate between about 20,000 sccm and about 60,000 sccm for a chamber with 4 stations for processing 4 wafers.

A SnO first conformal spacer material may be amorphous. A SnO first conformal spacer material may be deposited by PEALD or thermal ALD. ALD is a technique that deposits thin layers of material using sequential self-limiting reactions. ALD processes use surface-mediated deposition reactions to deposit films on a layer-by-layer basis in cycles. As an example, an ALD cycle may include the following operations: (i) delivery/adsorption of a precursor, (ii) purging of precursor from the chamber, (iii) delivery of a second reactant and optionally ignite plasma, and (iv) purging of byproducts from the chamber. The reaction between the second reactant and the adsorbed precursor to form a film on the surface of a substrate affects the film composition and properties, such as nonuniformity, stress, wet etch rate, dry etch rate, electrical properties (e.g., breakdown voltage and leakage current), etc.

An ALD cycle is the minimum set of operations used to perform a surface deposition reaction one time. In some embodiments, the result of one cycle is production of at least a partial SnO film layer on a substrate surface. The cycle may include certain ancillary operations such as sweeping one of the reactants or byproducts and/or treating the partial film as deposited. Generally, a cycle contains one instance of a unique sequence of operations.

Unlike a chemical vapor deposition (CVD) technique, ALD processes use surface-mediated deposition reactions to deposit films on a layer-by-layer basis. In one example of an ALD process, a substrate surface that includes a population of surface active sites is exposed to a gas phase distribution of a first precursor, such as a tin-containing precursor, in a dose provided to a chamber housing a substrate. Molecules of this first precursor are adsorbed onto the substrate surface, including chemisorbed species and/or physisorbed molecules of the first precursor. It should be understood that when a compound is adsorbed onto the substrate surface as described herein, the adsorbed layer may include the compound as well as derivatives of the compound. For example, an adsorbed layer of a tin-containing precursor may include the tin-containing precursor as well as derivatives of the tin-containing precursor. After a first precursor dose, the chamber is then evacuated to remove most or all of first precursor remaining in gas phase so that mostly or only the adsorbed species remain. In some implementations, the chamber may not be fully evacuated. For example, the reactor may be evacuated such that the partial pressure of the first precursor in gas phase is sufficiently low to mitigate a reaction. A second reactant, such as an oxygen-containing gas, is introduced to the chamber so that some of these molecules react with the first precursor adsorbed on the surface. In some processes, the second precursor reacts immediately with the adsorbed first precursor. In other embodiments, the second reactant reacts only after a source of activation is applied temporally. The chamber may then be evacuated again to remove unbound second reactant molecules. As described above, in some embodiments the chamber may not be completely evacuated. Additional ALD cycles may be used to build film thickness.

In some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in their entireties.

In some embodiments, SnO first conformal spacer materials are deposited at temperatures less than about 200° C. In some embodiments, SnO first conformal spacer material is deposited at temperatures less than the temperature used to deposit the core material. Since SnO has a high deposition rate, the first few layers of SnO is formed and act as a barrier thereby reducing damage to the underlying patterned carbon core.

Below are several techniques for depositing a first conformal spacer material that is SnO. Although SnO is described in this example, it will be understood that for embodiments where the second conformal spacer material is SnO but the first conformal spacer material is another material (such as described above with respect to Table 1), any of the described techniques herein may be used to deposit a SnO second conformal spacer material.

Figure 3B:
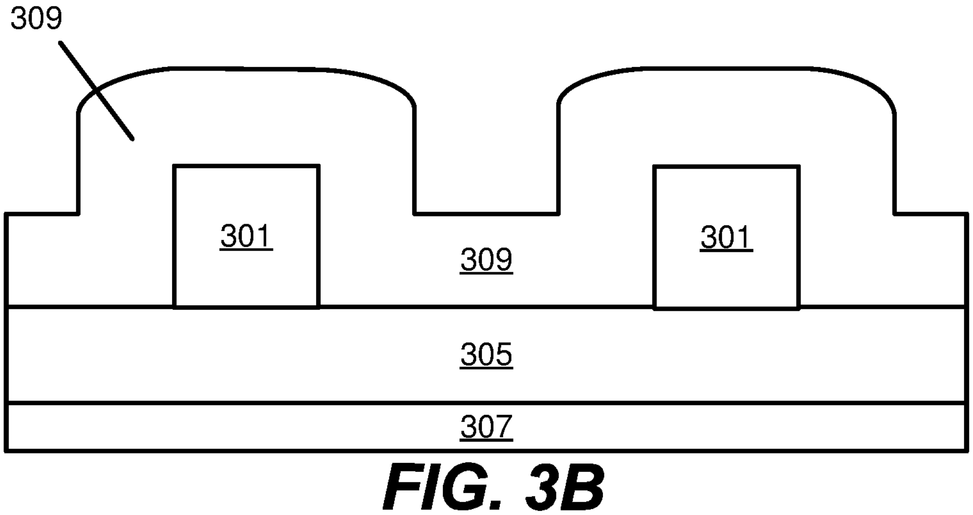

A SnO first conformal spacer material may be deposited by any suitable method such as by chemical vapor deposition (CVD) (including plasma-enhanced chemical vapor deposition (PECVD)), ALD (including PEALD), sputtering, etc. In some embodiments, it is preferable to deposit the SnO first conformal spacer material conformally, such that it follows the surface of the patterned core 301, as shown in FIG. 3B. In some embodiments, the SnO first conformal spacer material is deposited conformally to a thickness of between about 5 nm and about 30 nm, such as between about 10 nm and about 20 nm. One of the suitable deposition methods of conformal SnO first conformal spacer material is ALD. Thermal or plasma enhanced ALD can be used. In a typical thermal ALD method, the substrate is provided to an ALD process chamber and is sequentially exposed to a tin-containing precursor, and an oxygen-containing reactant, where the tin-containing precursor and the oxygen containing reactant are allowed to react on the surface of the substrate to form SnO. The ALD process chamber is typically purged with an inert gas after the substrate is exposed to the tin-containing precursor, and before the oxygen-containing reactant is admitted to the process chamber to prevent reaction in the bulk of the process chamber. Further, the ALD process chamber is typically purged with an inert gas after the substrate has been treated with the oxygen-containing reactant. The sequential exposure is repeated for several cycles. Non-limiting examples of the number of cycles include at least about 1 cycle, or at least about 10 cycles, or at least about 100 cycles, or between about 10 cycles and 100 cycles. Cycles can be performed until the SnO first conformal spacer material having desired thickness is deposited. Examples of suitable tin-containing precursors include halogenated tin-containing precursors (such as tin (IV) chloride ($SnCl_4$); tin(IV) bromide ($SnBr_4$)), and non-halogenated tin-containing precursors, including organotin precursors such as organometallic tin-containing compounds with alkyl substituted tin amides and the like. Specific examples of alkyl substituted tin amides that are suitable for ALD are tetrakis(dimethylamino) tin ($Sn(NMe_2)_4$; tetrakis(ethylmethylamino) tin; $N^2$,$N^3$-di-tert-butyl-butane-2,3-diamino-tin(II); and Sn(II)(1,3-bis(1,1-dimethylethyl)-4,5-dimethyl-(4R,5R)-1,3,2-diazastannolidin-2-ylidene).

Example SnO deposition precursors include tin halides, tin hydrides, organic tin compounds, chlorinated organic tin-containing compounds, and combinations thereof. Specific precursors include but are not limited to stannous fluoride ($SnF_2$); $SnCl_4$; $SnBr_4$; tin hydride ($SnH_4$); tetrakis (ethylmethylamino)tin ($Sn(NMeEt)_4$); Sn(II)(1,3-bis(1,1-dimethylethyl)-4,5-dimethyl-(4R,5R)-1,3,2-diazastannolidin-2-ylidene); $N^2$,$N^3$-di-tert-butyl-butane-2,3-diamino-tin(II); tetraethyl tin ($SnEt_4$); tetramethyl tin ($SnMe_4$); dibutyltin diacetate ($Bu_2Sn(OAc)_2$); (dimethylamino)trimethyl tin(IV) ($Me_3Sn(NMe_2)$); and tetrakis(diethylamido)tin(IV) ($Sn(NEt_2)_4$).

Additional examples also include: trimethyl tin chloride shown in (I) below; dimethyl tin dichloride shown in (II) below; methyl tin trichloride shown in (III) below; bis[bis (trimethylsilyl)amino]tin(II) shown in (IV) below (where TMS is trimethylsilyl); hexaphenylditin(IV) shown in (V); acetylacetonate shown in (VI); trimethyl(phenylethynyl)tin shown in (VII); dibutyldiphenyltin shown in (VIII); tetraallyltin shown in (IX); tetravinyltin shown in (X) tricyclohexyltin hydride shown in (XI); and trimethylphenyl tin shown in (XII).

(I)

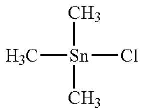

(II)

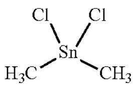

(III)

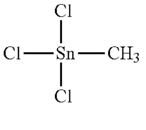

-continued (IV)

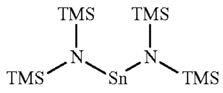

(V)

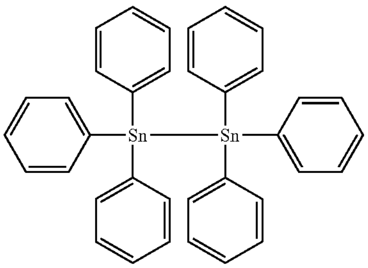

(VI)

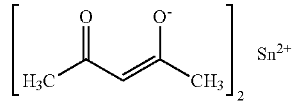

(VII)

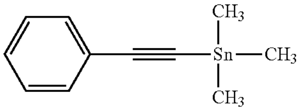

(VIII)

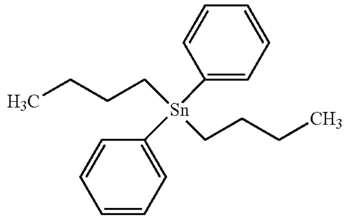

(IX)

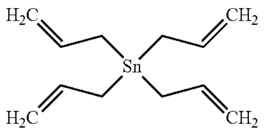

(X)

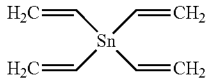

(XI)

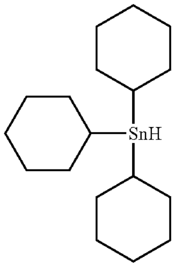

(XII)

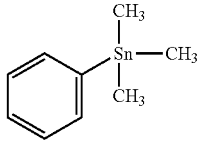

Oxygen-containing reactants include without limitation oxygen, ozone, water, hydrogen peroxide, and NO. Mixtures of oxygen-containing reactants can also be used. The deposition conditions will vary depending on the choice of ALD reactants, where more reactive precursors will generally react at lower temperatures than less reactive precursors. The processes typically will be carried out at a temperature of between about 20° C. and about 500° C., and at a subatmospheric pressure. The temperature and pressure are selected such that the reactants remain in the gaseous form in the process chamber to avoid condensation. Each reactant is provided to the process chamber in a gaseous form either alone or mixed with a carrier gas, such as argon, helium, or nitrogen. The flow rates of these mixtures will depend on the size of the process chamber, and are in some embodiments between about 10 sccm and about 10,000 sccm.

A specific example of thermal ALD process conditions that are suitable for depositing a SnO first conformal spacer material provided herein is described in an article by Li et al. titled "Tin Oxide with Controlled Morphology and Crystallinity by Atomic Layer Deposition onto Graphene Nanosheets for Enhanced Lithium Storage" (Advanced Functional Materials, 2012, 22, 8, 1647-1654) which is herein incorporated by reference in its entirety. The process includes sequentially and alternately exposing the substrate in an ALD vacuum chamber to $SnCl_4$ (the tin-containing precursor) and deionized water (the oxygen-containing reactant) at a temperature of 200-400° C. In a specific example of an ALD cycle, a mixture of $SnCl_4$ vapor with $N_2$ carrier gas is introduced into the ALD process chamber for 0.5 seconds, and is then exposed to the substrate for 3 seconds. Next the ALD process chamber is purged with $N_2$ for 10 seconds to remove $SnCl_4$ from the bulk of the process chamber, and a mixture of $H_2O$ vapor with $N_2$ carrier gas is flowed into the process chamber for 1 second and is exposed to the substrate for 3 seconds. Next, the ALD process chamber is purged with $N_2$ and the cycle is repeated. The ALD process is performed at subatmospheric pressure (e.g., 0.4 Torr) and at a temperature of 200-400° C.

Another example of thermal ALD process conditions that are suitable for depositing SnO films in the methods provided herein, is given in an article by Du et al. titled "In situ Examination of Tin Oxide Atomic Layer Deposition using Quartz Crystal Microbalance and Fourier Transform Infrared Techniques" (J. Vac. Sci. Technol. A 23, 581 (2005)), which is herein incorporated by reference in its entirety. In this process the substrate is sequentially exposed to $SnCl_4$ and $H_2O_2$ in an ALD process chamber at a temperature of between about 150-430° C.

While the use of halogenated tin precursors in ALD is suitable in many embodiments, in some embodiments it is more preferable to use non-halogenated organotin precursors to avoid corrosion problems that may occur with the use of halogenated precursors such as $SnCl_4$. Examples of suitable non-halogenated organotin precursors include alkylaminotin (alkylated tin amide) precursors, such as tretrakis (dimethylamino) tin. An example of a suitable thermal ALD deposition method that uses this precursor is provided in an article by Elam et al., titled "Atomic Layer Deposition of Tin Oxide Films using Tetrakis(dimethylamino) tin" (J. Vac. Sci. Technol. A 26, 244 (2008)), which is herein incorporated by reference in its entirety. In this method the substrate is sequentially exposed in an ALD chamber to tetrakis(dimethylamino) tin and $H_2O_2$ at a temperature of between about 50-300° C. Advantageously, the use of this precursor allows deposition of SnO first conformal spacer material at low temperatures of 100° C. or less. For example, SnO films can be deposited at 50° C. without the use of plasma to enhance reaction rate. Another example of thermal ALD of SnO using tetrakis(dimethylamino) tin and $H_2O_2$ is provided in an article by Elam et al. titled "Atomic Layer Deposition of Indium Tin Oxide Thin Films Using Nonhalogenated Precursors" (J. Phys. Chem. C 2008, 112, 1938-1945), which is herein incorporated by reference.

Another example of low temperature thermal ALD process with the use of a reactive organotin precursor is provided in an article by Heo et al., titled "Low temperature Atomic Layer Deposition of Tin Oxide" (Chem. Mater., 2010, 22(7) 4964-4973), which is herein incorporated by reference in its entirety. In this deposition process (which is suitable for depositing SnO films provided herein), the substrate is sequentially exposed in an ALD vacuum process chamber to $N^2$,$N^3$-di-tert-butyl-butane-2,3-diamino-tin(II) and 50% $H_2O_2$. These reactants are vaporized and each is provided to the process chamber mixed with an $N_2$ carrier gas. The chamber is purged with $N_2$ after each exposure of the substrate to a reactant. The deposition can be carried out at a temperature of between about 50-150° C.

While hydrogen peroxide generally works well as an oxygen-containing reactant for formation of SnO first conformal spacer material in ALD processes, it may sometimes provide insufficient control over SnO film growth due to $H_2O_2$ decomposition. In some embodiments, a more stable oxygen-containing precursor, such as NO, is used. An example of suitable process conditions with the use of NO as an oxygen-containing reactant is provided in an article by Heo et al., titled "Atomic Layer Deposition of Tin Oxide with Nitric Oxide as an Oxidant Gas" (J. Mater. Chem., 2012, 22, 4599), which is herein incorporated by reference. The deposition involves exposing the substrate sequentially to a cyclic Sn(II) amide (1,3-bis(1,1-dimethylethyl)-4,5-dimethyl-(4R,5R)-1,3,2-diazastannolidin-2-ylidine and to NO at a temperature of about 130-250° C.

In some embodiments, SnO first conformal spacer materials are deposited by PEALD. The same types of tin-containing precursors and oxygen-containing reactants as described above for thermal ALD can be used. In PEALD the ALD apparatus is equipped with a system for generating plasma in the process chamber, and for treating the substrate with the plasma. In a typical PEALD process sequence, the substrate is provided to the PEALD process chamber and is exposed to the tin-containing precursor which adsorbs on the surface of the substrate. The process chamber is purged with an inert gas (e.g., argon or helium) to remove the precursor from the process chamber, and the substrate is exposed to an oxygen-containing reactant which is introduced into the process chamber. Concurrently with the introduction of the oxygen-containing reactant or after a delay, plasma is formed in the process chamber. The plasma facilitates the reaction between the tin-containing precursor and the oxygen-containing reactant on the surface of the substrate that results in formation of SnO first conformal spacer material. Next, the process chamber is purged with an inert gas, and the cycle comprising tin precursor dosing, purging, oxygen-containing reactant dosing, plasma treatment, and second purging is repeated as many times as necessary to form a SnO first conformal spacer material of desired thickness.

An example of process conditions that are suitable for PEALD formation of SnO film is provided in an article by Seop et al., titled "The Fabrication of Tin Oxide Films by Atomic Layer Deposition using Tetrakis(ethylmethylamino) tin Precursor" (Transactions on Electrical and Electronic Materials, 2009, 10, 5, 173-176), which is herein incorporated by reference. The substrate is provided into a PEALD process chamber and is exposed to tetrakis(ethylmethylamino) tin in an absence of plasma with an exposure of 4 seconds. Next, the tin-containing precursor is purged from the process chamber by flowing argon through the process chamber for 20 seconds. Then, $O_2$ is injected for 2 seconds with additional 2 seconds with radio frequency (RF) power of 100 W. This is followed by an argon purge, which completes one PEALD cycle. In this example, the process is conducted at a temperature range of 50-200° C. and at a pressure of 0.8 Torr.

While ALD (both thermal and plasma enhanced) are methods for depositing SnO first conformal spacer material, it is understood that other SnO deposition methods, such as CVD, PECVD, and sputtering can also be used.

FIG. 3B shows an example schematic illustration whereby first conformal spacer material 309 is deposited conformally over patterned core 301.

Horizontal regions of the first conformal spacer material are removed by etching.

Figure 3C:
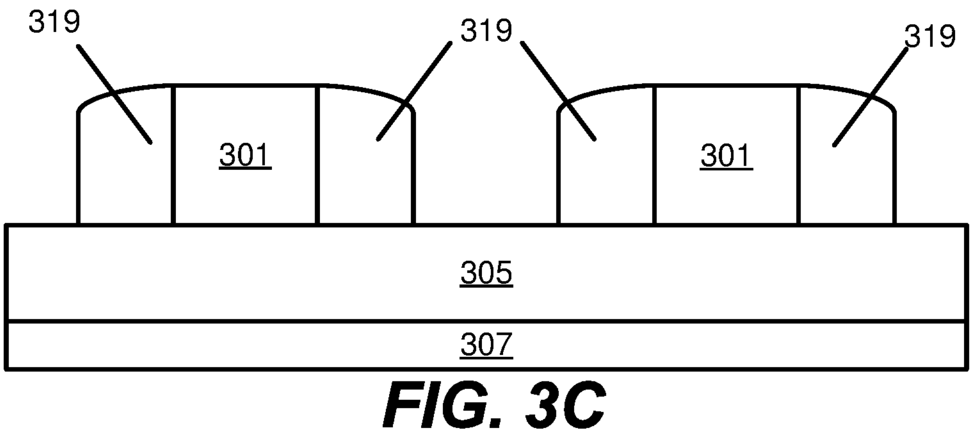

Formation of SnO spacers is illustrated by FIGS. 3B and 3C. First, first conformal spacer material 309 is etched from the horizontal surfaces over patterned core 301 such as described above, without being fully etched from positions that adhere to the sidewalls of patterned core 301. This etch exposes the target layer 305 everywhere with the exception of locations near the sidewalls of the patterned core 301. Further, this etch exposes the top portions of the patterned core 301. The resulting structure is shown in FIG. 3C. The chemistry of this etch will depend on the type of materials that are used for target layers 305 and patterned core 301.

Example methods of etching horizontal regions of the first conformal spacer material are described in U.S. Pat. No. 9,824,893 which issued on Nov. 21, 2017 and is incorporated by reference in its entirety and for all purposes.

SnO can be etched using a number of wet etching and dry etching techniques. In wet etching the substrate is contacted with the wet etchant, which can be, for example, sprayed onto the substrate. Alternatively, the substrate can be dipped into the wet (aqueous) etchant. In dry etching the substrate is positioned in a dry etch chamber, where the substrate is contacted with a gaseous etchant with or without the use of plasma. “Wet etching” as used herein refers to etching with liquid etchants, whereas “dry etching” refers to etching with gaseous (including vaporized) etchants, regardless of the use of water. One example of wet etching that is suitable for etching SnO is an acid etch, where the substrate is contacted with an aqueous solution of an acid, such as HCl.

In one implementation of an HCl etch the substrate is contacted with an aqueous solution prepared from an aqueous solution of HCl and chromium metal.

In another example of a wet etching process the SnO layer is treated with aqueous HX (where X is Cl, Br, or I) in a presence of zinc powder. In this method the oxides are reduced directly by the hydrogen formed in a reaction of zinc with HX. In another wet etching embodiment, SnO is etched by aqueous phosphoric acid, e.g., provided at $H_3PO_4$:$H_2O$ ratio of 1:3. Further, SnO films can be etched by a mixture of aqueous $HNO_3$ and HCl or by aqueous HI at a temperature of about 60° C.

One example of dry etch chemistry for SnO removal includes treatment with HBr in a plasma. This treatment is described in an article by Kwon et al., titled “Etch Mechanism of $In_2O_3$ and $SnO_2$ thin films in HBr-based inductively coupled plasmas” (J. Vac. Sci. Technol. A 28, 226 (2010)), which is herein incorporated by reference in its entirety. The substrate is treated with inductively coupled plasma formed in a process gas containing HBr and argon.

In another embodiment, HBr-containing process gas further includes an oxygen-containing compound, such as $O_2$. In some embodiments, etching is performed by exposing the substrate to a plasma formed in a process gas comprising HBr, $O_2$, and $N_2$. This type of etch can remove SnO material selectively relative to materials, such as silicon, and silicon oxide. It is noted that the surface of the silicon mandrels is typically covered with a layer of silicon dioxide, which protects it from being etched with this etch chemistry. In some embodiments, the process conditions of this etching step include applying a relatively high radio frequency (RF) bias to the substrate holder, such as to increase the energy of ions in the plasma and increase the etch rate of SnO material. Other dry etching chemistries that are suitable for SnO removal include plasma treatment in a mixture of $Cl_2$ and hydrocarbon, and plasma treatment in a process gas comprising chlorohydrocarbon, such as $CH_2Cl_2$ or $CHCl_3$. In some embodiments, the substrate containing an exposed SnO layer is contacted with a plasma formed in a process gas comprising $CH_4$ and $Cl_2$.

Yet another suitable dry etching chemistry for removal of SnO films is hydrogen-based plasma. In some embodiments, SnO is etched by exposing the substrate to a plasma formed in a process gas comprising $H_2$. In some embodiments plasma is formed in a process gas formed in a mixture of $H_2$ and a hydrocarbon (e.g., $CH_4$).

In some embodiments removal of SnO layer from horizontal portions of the substrate involves using two steps with two different chemistries. In a first step, referred to as the main etch, the bulk of SnO layer is removed from horizontal surfaces, without fully exposing the underlying layers of mandrel material, underlying target layer, or optional etch stop layer (ESL) material. Etch chemistry of the main etch, therefore, does not need to be selective. In some embodiments the main etch is performed by treating the substrate with a plasma formed in a process gas comprising $Cl_2$ and a hydrocarbon (e.g., $Cl_2$ and $CH_4$). After the main etch etches through the SnO film or shortly before, the etching chemistry is switched to an over etch chemistry. The endpoint for the main etch can be detected by using an optical probe, which will signal when the mandrel material, underlying target layer, or optional ESL material becomes exposed. Over etch chemistry is used to remove leftover SnO film without substantially etching the materials of mandrel material, underlying target layer, or optional ESL material. The ratio of the etch rate of SnO to the etch rate of the mandrel material for the over etch chemistry is preferably greater than 1. The ratio of the etch rate of SnO to the etch rate of the optional ESL material for the over etch chemistry is also preferably greater than 1. In some embodiments (e.g., when silicon mandrel and silicon oxide ESL are used) the over etch includes exposing the substrate having leftover SnO film, exposed mandrels and exposed ESL to a plasma formed in a process gas comprising HBr, $N_2$, and $O_2$.

The SnO etching in this step removes SnO from horizontal surfaces (such as shown in FIG. 3C), but the vertical portions of SnO layer at the sidewalls of the mandrels remain on the substrate. Next, mandrels such as patterned core 301 in FIG. 3C are removed from the substrate leaving exposed first spacers 319. Removal of the mandrels is performed by exposing the substrate to an etch chemistry that selectively etches the mandrel material. Thus, the ratio of the etch rate of the mandrel material to the etch rate of the SnO in this step is greater than 1, and is more preferably greater than 1.5. Further, the etch chemistry used in this step should selectively etch the mandrel material relative to ESL material. A variety of etching methods can be used, and specific choice of chemistry depends on the material of the mandrel and on the material of the ESL layer. When the mandrel is made of amorphous silicon and the ESL material is silicon oxide, mandrels can be removed by using an oxidative oxygen-containing plasma. For example, silicon mandrels can be selectively etched by exposing the substrate to a plasma formed in a process gas composed of HBr and $O_2$. This chemistry will selectively etch the silicon material in a presence of SnO and silicon oxide. In some embodiments, before the etch starts, the thin protective layer of silicon oxide is removed from the surface of silicon mandrels. This can be done by briefly exposing the substrate to a plasma formed in a process gas comprising a fluorocarbon. After removal of the protective silicon oxide layer from the mandrels, the silicon is selectively etched. In some embodiments, it is preferable to use a relatively small RF bias, or no external bias at all for the substrate in this step. If no external bias is used, the self bias of the substrate (10-20 V) is sufficient. Under no bias or low bias conditions, the $HBr/O_2$ plasma will selectively etch silicon in the presence of SnO and silicon oxide.

Returning to FIG. 2, in operation 205, the patterned core material is selectively removed to leave the first spacers on the substrate. The patterned core material is exhumed from the substrate. In some embodiments, the selective removal of the patterned core material during this operation involves flowing etching gases suitable for etching material used for the patterned core material. In embodiments where the patterned core material is a carbon-containing material, and oxygen-containing etching chemistry may be used. In some embodiments, the patterned core material is etched without using a plasma. In some embodiments, the patterned core material is etched using a plasma. For example, the patterned core material may be etched using an oxidative oxygen-containing plasma.

In operation 207, a second conformal spacer material is deposited over the first spacers. Process conditions for this operation depend on the material selected for the second conformal spacer material. The second conformal spacer material may be deposited by ALD or PEALD. In some embodiments, other techniques such as CVD and PECVD may be used.

The first spacers thereby act as a mandrel under the second conformal spacer material. The second conformal spacer material may be any oxide, nitride, or carbide film. Non-limiting examples of oxide materials that may be used for the second conformal spacer material include titanium dioxide and hafnium oxide. A non-limiting example of a nitride material that may be used for the second conformal spacer material is silicon nitride. For such embodiments, the first conformal spacer material having SnO acts as a mandrel for the second conformal spacer material.

Figure 3D:
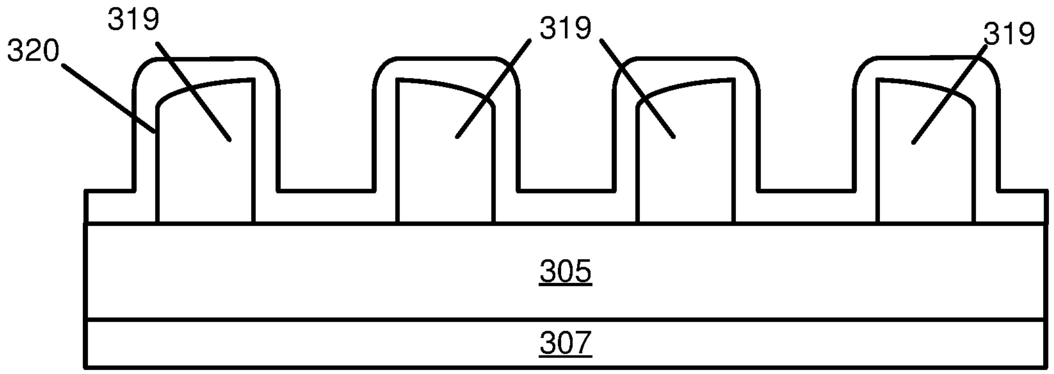

FIG. 3D shows an example of a substrate after selectively removing patterned core 301 and depositing a second conformal spacer material 320 over the first spacers 319, the features of which now act as second mandrels.

Where the first conformal spacer material is SnO, the second conformal spacer material may include silicon dioxide, silicon nitride, titanium dioxide, hafnium oxide, or any other oxide, nitride, or carbide film. In particular, the silicon dioxide material used can be a silicon dioxide film deposited at high temperatures due to the SnO first conformal spacer material being able to withstand higher temperature deposition conditions.

The second conformal spacer material may be deposited using any suitable technique, such as ALD or PEALD.

For silicon-containing oxides, nitrides, or carbides, a silicon-containing precursor may be used to deposit the second conformal film. The deposition precursor is selected based on the material to be deposited in the large gaps. For example, for deposition of silicon oxide, a silicon-containing precursor may be selected. Example silicon-containing precursors include silicon-containing precursors having the structure:

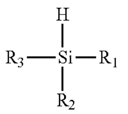

where $R_1$, $R_2$, and $R_3$ may be the same or different substituents, and may include silanes, amines, halides, hydrogen, or organic groups, such as alkylamines, alkoxy, alkyl, alkenyl, alkynyl, and aromatic groups.

Example silicon-containing precursors include polysilanes ($H_3Si—(SiH_2)_n—SiH_3$), where n≥1, such as silane, disilane, trisilane, tetrasilane; and trisilylamine:

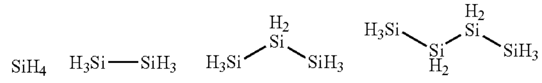

silane disilane trisilane tetrasilane

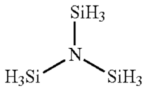

trisilylamine

In some embodiments, the silicon-containing precursor is an alkoxysilane. Alkoxysilanes that may be used include, but are not limited to, the following:

$H_x$—Si—$(OR)_y$, where x=1-3, x+y=4 and R is a substituted or unsubstituted alkyl group; and $H_x(RO)_y$—Si—Si—$(OR)_yH_x$ where x=1-2, x+y=3 and R is a substituted or unsubstituted alkyl group.

Examples of silicon-containing precursors include: methylsilane; trimethylsilane (3MS); ethylsilane; butasilanes; pentasilanes; octasilanes; heptasilane; hexasilane; cyclobutasilane; cycloheptasilane; cyclohexasilane; cyclooctasilane; cyclopentasilane; 1,4-dioxa-2,3,5,6-tetrasilacyclohexane; diethoxymethylsilane (DEMS); diethoxysilane (DES); dimethoxymethylsilane; dimethoxysilane (DMOS); methyl-diethoxysilane (MDES); methyl-dimethoxysilane (MDMS); octamethoxydodecasiloxane (OMODDS); tert-butoxydisilane; tetramethylcyclotetrasiloxane (TMCTS); tetraoxymethylcyclotetrasiloxane (TOMCTS); triethoxysilane (TES); triethoxysiloxane (TRIES); and trimethoxysilane (TMS or TriMOS).

In some embodiments, the silicon-containing precursor may be an aminosilane, with hydrogen atoms, such as bisdiethylaminosilane, diisopropylaminosilane, bis(tert-butyl)amino silane (BTBAS), or tris(dimethylamino) silane (3DMAS). Aminosilane precursors include, but are not limited to, the following: $H_x$—Si—$(NR)_y$ where x=1-3, x+y=4 and R is an organic or hydride group.

In some embodiments, a halogen-containing silane may be used such that the silane includes at least one halogen atom. Such a silane may have a chemical formula of $SiX_aH_y$ where y≥1. For example, dichlorosilane ($H_2SiCl_2$) may be used in some embodiments.

Precursor molecules for depositing silicon carbides can include silicon-containing molecules having silicon-hydrogen (Si—H) and/or silicon-silicon (Si—Si) bonds, and silicon-carbon (Si—C) bonds. In some embodiments, precursor molecules for depositing a silicon carbide carbon-containing encapsulation layer may be a silicon-containing and carbon-containing precursor.

Precursor molecules for depositing silicon oxycarbides include silicon-containing molecules having silicon-hydrogen (Si—H) bonds and/or silicon-silicon (Si—Si) bonds, and silicon-oxygen (Si—O) bonds and/or silicon-carbon (Si—C) bonds. Precursor molecules for depositing silicon nitricarbides include silicon-containing molecules having silicon-hydrogen (Si—H) bonds and/or silicon-silicon (Si—Si) bonds, and silicon-nitrogen (Si—N) bonds and/or silicon-carbon (Si—C) bonds. Precursor molecules for depositing silicon oxynitricarbides include silicon-containing molecules having silicon-hydrogen (Si—H) bonds and/or silicon-silicon (Si—Si) bonds, and silicon-nitrogen (Si—N) bonds, silicon-oxygen (Si—O) bonds, and/or silicon-carbon (Si—C) bonds. In some embodiments, the silicon-containing precursors can include a reactant with Si—O bonds and a reactant with Si—C bonds. It will be understood that any number of suitable reactants may be employed in the scope of this present disclosure. The silicon-containing precursors include one or more Si—H bonds and/or one or more Si—Si bonds. During the deposition process, the Si—H bonds and/or Si—Si bonds are broken and serve as reactive sites for forming bonds between the silicon-containing precursors in a deposited silicon carbide film as a carbon-containing encapsulation layer. The broken bonds can also serve as sites for cross-linking during thermal processing conducted during or after deposition. Bonding at the reactive sites and cross-linking can form a primary backbone or matrix collectively in the resulting silicon carbide film as a carbon-containing encapsulation layer. Although silicon carbide films are described herein as example carbon-containing encapsulation layers, it will be understood that other carbon-containing encapsulation layers may be deposited. For example, the carbon-containing encapsulation layer may include any of silicon carbide, oxygen-doped silicon carbide, nitrogen-doped silicon carbide, boron-and-nitrogen-doped silicon carbide, and combinations thereof. Further, it will be understood that in some embodiments, the carbon-containing encapsulation layer may include one or more layers of carbon-containing material having any one or more of the above identified materials, and may be referred to in some cases as a carbon-containing encapsulation film.

As discussed, the precursors employed in forming silicon carbide films can include silicon-containing precursors, with at least some of the silicon-containing precursors having at least one Si—H and/or at least one Si—Si bond. In certain embodiments, the silicon-containing precursor has at most one hydrogen atom on every silicon atom. Thus, for example, a precursor having one silicon atom has at most one hydrogen atom bonded to the silicon atom; a precursor having two silicon atoms has one hydrogen atom bonded to one silicon atom and optionally another hydrogen atom bonded to the second silicon atom; a precursor having three silicon atoms has at least one hydrogen atom bonded to one silicon atom and optionally one or two more hydrogen atoms bonded to one or two of the remaining silicon atoms, and so on. In addition, the silicon-containing precursors may include at least one Si—O bond, at least one Si—N bond, and/or at least one Si—C bond. While any number of appropriate precursors can be used in forming silicon carbide films, at least some of the precursors will include silicon-containing precursors with at least one Si—H bond or Si—Si bond, and optionally at least one Si—O bond, Si—N bond, and/or Si—C bond. In various implementations, the silicon-containing precursor(s) contain no O—C or N—C bonds; e.g., the precursor(s) contain no alkoxy (—O—R), where R is an organic group such as a hydrocarbon group, or amine (—$NR_1R_2$) groups, whereby $R_1$ and $R_2$ are independently hydrogen or organic groups.

In certain embodiments, at least some of the carbon provided for the silicon carbide film is provided by one or more hydrocarbon moieties on the silicon-containing precursor. Such moieties may be from alkyl groups, alkene groups, alkyne groups, aryl groups, and the like. In certain embodiments, the hydrocarbon group has a single carbon atom to minimize steric hindrance of the Si—H and/or Si—Si bond breaking reaction during deposition. However, the precursors are not limited to single-carbon groups; higher numbers of carbon atoms may be used such as 2, 3, 4, 5, or 6 carbon atoms. In certain embodiments, the hydrocarbon group is linear. In certain embodiments, the hydrocarbon group is cyclic.

In some embodiments, the silicon-containing precursor falls into a chemical class. It will be understood that other chemical classes of silicon-containing precursors may be employed and that the silicon-containing precursors are not limited to the chemical classes discussed below.

In some embodiments, the silicon-containing precursor can be a siloxane. In some embodiments, the siloxane may be cyclic. Cyclic siloxanes may include cyclotetrasiloxanes, such as 2,4,6,8-tetramethylcyclotetrasiloxane (TMCTS), octamethylcyclotetrasiloxane (OMCTS), and heptamethylcyclotetrasiloxane (HMCTS). Other cyclic siloxanes can also include but are not limited to cyclotrisiloxanes and cyclopentasiloxanes. Embodiments using cyclic siloxanes are ring structures that can introduce porosity into an oxygen doped silicon carbide film, with the size of the pores corresponding to the radius of the ring. For example, a cyclotetrasiloxane ring can have a radius of about 6.7 Å.

In some embodiments, the siloxane may have a three-dimensional or caged structure. Caged siloxanes have silicon atoms bridged to one another via oxygen atoms to form a polyhedron or any 3-D structure. An example of a caged siloxane precursor molecule is silsesquioxane. Caged siloxane structures are described in further detail in commonly owned U.S. Pat. No. 6,576,345 to Cleemput et al., which is incorporated by reference herein in its entirety and for all purposes. Like the cyclic siloxanes, the caged siloxane can introduce porosity into an oxygen doped silicon carbide film. In some embodiments, the porosity scale is mesoporous.

In some embodiments, the siloxane may be linear. Examples of suitable linear siloxanes include but are not limited to disiloxanes, such as pentamethyldisiloxane (PMDSO) and tetramethyldisiloxane (TMDSO), and trisiloxanes such as hexamethyltrisiloxane, heptamethyltrisiloxane.

In some embodiments, the silicon-containing precursor can be an alkyl silane or other hydrocarbon-substituted silane. The alkyl silanes include a central silicon atom with one or more alkyl groups bonded to it as well as one or more hydrogen atoms bonded to it. In certain embodiments, any one or more of the alkyl groups contain 1-5 carbon atoms. The hydrocarbon groups may be saturated or unsaturated (e.g., alkene (e.g., vinyl), alkyne, and aromatic groups). Examples include but are not limited to trimethylsilane (3MS), triethylsilane, pentamethyl disilamethane ($(CH_3)_2Si—CH_2—Si(CH_3)_3$), and dimethylsilane (2MS).

In some embodiments, the silicon-containing precursor can be an alkoxy silane. The alkoxy silanes include a central silicon atom with one or more alkoxy groups bonded it and one or more hydrogen atoms bonded to it. Examples include but are not limited to trimethoxysilane (TMOS), dimethoxysilane (DMOS), methoxysilane (MOS), methyldimethoxysilane (MDMOS), diethyoxymethylsilane (DEMS), dimethylethoxysilane (DMES), and dimethylmethoxysilane (DMMOS).

Additionally, disilanes, trisilanes, or other higher silanes may be used in place of monosilanes. An example of one such disilane from the alkyl silane class is hexamethyldisilane (HMDS). Another example of a disilane from the alkyl silane class can include pentamethyldisilane (PMDS). Other types of alkyl silanes can include alkylcarbosilanes, which can have a branched polymeric structure with a carbon bonded to a silicon atom as well as alkyl groups bonded to a silicon atom. Examples include dimethyl trimethylsilyl methane (DTMSM) and bis-dimethylsilyl ethane (BDMSE). In some embodiments, one of the silicon atoms can have a carbon-containing or hydrocarbon-containing group attached to it, and one of the silicon atoms can have a hydrogen atom attached to it.

For embodiments involving deposition of silicon oxide as second conformal spacer material, silicon oxide may be deposited by using a silicon-containing precursor and an oxygen-containing reactant. An oxygen-containing reactant is a reactant or mixture of reactants that includes at least one oxygen, for example, oxygen, ozone, and the like.

For embodiments involving deposition of silicon nitride as second conformal spacer material, silicon nitride materials may be deposited using a silicon-containing precursor and a nitrogen-containing reactant. A nitrogen-containing reactant is a reactant or mixture of reactants that includes at least one nitrogen, for example, ammonia, hydrazine, amines (amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary, or quaternary (for example, tetraalkylammonium compounds). A nitrogen-containing reactant can contain heteroatoms other than nitrogen, for example, hydroxylamine, t-butyloxycarbonyl amine, and N-t-butyl hydroxylamine are nitrogen-containing reactants. Example nitrogen-containing reactants include nitrogen gas, ammonia, and amines.

For embodiments involving deposition of titanium oxide as second conformal spacer material, titanium-containing reactants may be used. Titanium oxide may be deposited on the substrate by exposing the substrate to a titanium-containing precursor and an oxidant, which react to form titanium oxide on the substrate. In various embodiments, the titanium-containing precursor is titanium tetraiodide. In some embodiments, the titanium-containing precursor is a metal-organic titanium precursor, such as TDMAT, TEMAT, or TDEAT. In some embodiments, titanium chloride is used as a precursor. Oxidants include oxygen ($O_2$), water ($H_2O$) such as water vapor, ozone ($O_3$), nitrous oxide ($N_2O$), hydrogen peroxide ($H_2O_2$), and other suitable oxidants. The precursor and oxidant may be introduced separately or together, diluted with an inert carrier gas, such as argon or nitrogen. The titanium oxide layer may be may be deposited by ALD, plasma enhanced ALD (PEALD), or conformal film deposition (CFD) methods. ALD processes use surface-mediated deposition reactions to deposit films on a layer-by-layer basis. In one example ALD process, a substrate surface, including a population of surface active sites, is exposed to a gas phase distribution of a first film precursor (P1), such as a titanium-containing precursor. Some molecules of P1 may form a condensed phase atop the substrate surface. The reactor is then evacuated to remove gas phase P1 so that only adsorbed species remain. A second film precursor (P2), such as an oxidant, is then introduced to the reactor so that some molecules of P2 adsorb to the substrate surface. The reactor may again be evacuated, this time to remove unbound P2. Subsequently, thermal energy provided to the substrate activates surface reactions between adsorbed molecules of P1 and P2, forming a film layer. Finally, the reactor is evacuated to remove reaction by-products and possibly unreacted P1 and P2, ending the ALD cycle. Additional ALD cycles may be included to build film thickness. In an example of a PEALD process, a plasma is initiated while the second film precursor P2 is introduced to the reactor to activate the reaction between P1 and P2.

The following conditions are examples of conditions suitable depositing a titanium oxide by an ALD process. Deposition may occur at a temperature between about 50° C. and about 400° C., at a pressure between about 0.5 Torr and about 10 Torr, and an RF power for four 300 mm stations between about 100 W and about 2500 W. Process gas flow rates may be as follows: for a titanium-containing precursor (TDMAT), between about 0.2 sccm and about 2.0 sccm; for oxygen precursor or oxidant ($O_2$, $N_2O$), between about 5000 sccm and 10,000 sccm, for example $N_2O$ at 5000 sccm; and for the carrier gas (Ar or $N_2$), between about 0 and 10,000 sccm, for example about 5000 sccm Ar.

For embodiments involving deposition of hafnium oxide, hafnium oxide may be deposited using a hafnium-containing precursor. Non-limiting examples include Tetrakis(ethylmethylamino)hafnium, tetrakis(ethylmethylamido)hafnium, and hafnium tetrachloride. Tetrakis(ethylmethylamino)hafnium, tetrakis(ethylmethylamido)hafnium, and hafnium tetrachloride each can be reacted with water, oxygen, or ozone to deposit hafnium oxide.

For embodiments involving deposition of lead oxide, lead oxide may be deposited using a lead-containing precursor. Non-limiting examples include lead diethyl-dithiocarbamate, tetraphenyl-lead, and lead 2,2,6,6-tetramethyl-3,5-heptadione. Lead diethyl-dithiocarbamate, tetraphenyl-lead, and lead 2,2,6,6-tetramethyl-3,5-heptadione can be each reacted with ozone, oxygen plasma, or water vapor to form lead oxide.

Returning to FIG. 2, in operation 209, the second conformal spacer material is etched to remove horizontal portions. Such etching is performed using gas and/or plasma chemistries based on the materials used for the second conformal spacer material. Etching is performed selectively to the SnO first spacers. The robustness of the SnO first spacers allows a variety of etching chemistries to be used to remove horizontal portions of the second conformal spacer material. For example, where the second conformal spacer material is silicon oxide material, fluorocarbon-containing gases and/or plasma chemistry may be used to selectively remove horizontal portions of the second conformal spacer material. In some embodiments, a bias is used to directionally etch horizontal regions of the second conformal spacer material. Removing the horizontal regions results in formation of second spacers having second conformal spacer material.

In operation 211, the first spacers are selectively removed relative to the second spacers to form a mask made of the second conformal spacer material. Selective removal is performed by exhuming. During this operation, SnO is selectively removed by exhuming SnO from the surface of the substrate. SnO can be selectively dry etched or exhumed using hydrogen chemistry without causing any etching of second spacers, which is not susceptible to etching when exposed to hydrogen. Such etching process has a high etch selectivity of SnO to second spacers.

Where the SnO is used as the second spacer and not the first, the first spacer removal may be performed using any suitable etching technique for etching silicon oxide, silicon nitride, titanium oxide, and lead oxide.

Figure 3E:
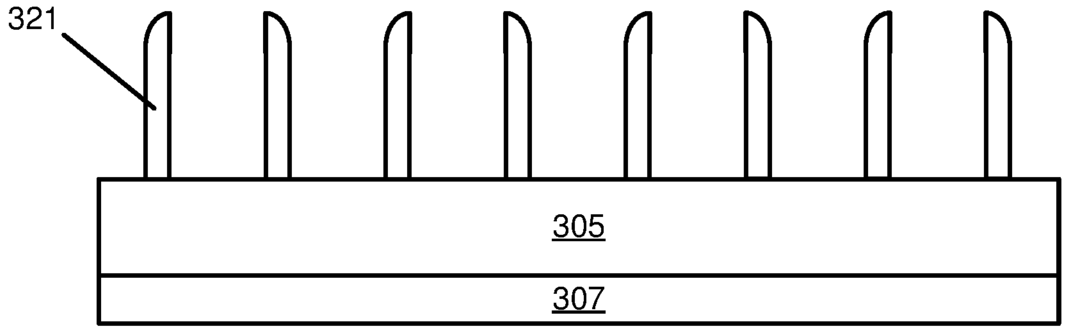

FIG. 3E shows an example whereby after horizontal regions of the second conformal spacer material 320 are removed, first spacers 319 are selectively exhumed from the substrate, leaving second spacers 321.

Returning to FIG. 2, in operation 213, the target layer is etched using the mask. The etch chemistry and process conditions depend on the chemistry of the target layer.

Figure 3F:
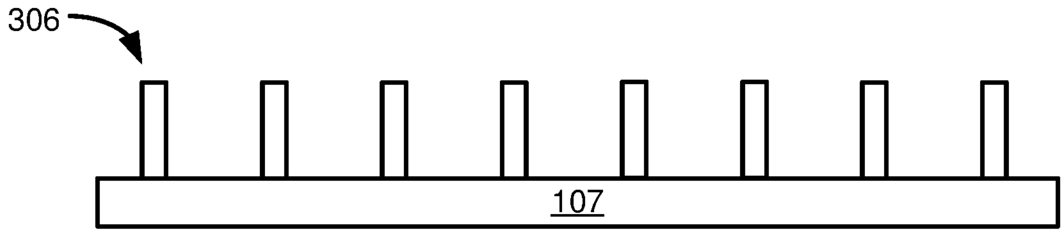

FIG. 3F shows the patterned target layer 306 after etching target layer 305 using the second spacer 321 as a mask. During such operation, the mask may burn away during etching. It is not necessary for the second spacer material to be exhumable as it can be etched or removed during the patterning of the target layer until the target layer is patterned. The patterned target layer 306 can have a pitch of about 40 nm or less.

In some embodiments, SnO can be used to create spacers in a self-aligned quad patterning scheme. SnO can form high modulus spacers that allows scaling of spacer thickness for smaller nodes that require even thinner spacers. Tin oxide spacers can thereby be dry etched using hydrogen while having lower wet etch rate in most wet etch chemistries, including but not limited to diluted hydrofluoric acid, phosphoric acid, tetramethylammonium hydroxide (TMAH), and standard clean #1 (SC1), which includes 5 parts deionized water, 1 part ammonia water (29% by weight of $NH_3$), and 1 part of aqueous 30% hydrogen peroxide ($H_2O_2$).

While the above example describes SnO as the material used for the first conformal spacer material and other oxides, nitrides, and carbides as the second conformal spacer material, alternative embodiments may be used.

In some embodiments, the first conformal spacer material is SnO and the second conformal spacer material is silicon dioxide. In some embodiments, the first conformal spacer material is SnO and the second conformal spacer material is silicon nitride. In some embodiments, the first conformal spacer material is SnO and the second conformal spacer material is titanium dioxide. In some embodiments, the first conformal spacer material is SnO and the second conformal spacer material is hafnium oxide. In some embodiments, the first conformal spacer material is SnO and the second conformal spacer material is another oxide, or a nitride, or a carbide. For these examples, the first spacer of SnO can be exhumed using hydrogen etch chemistry without etching silicon dioxide, silicon nitride, titanium dioxide, or hafnium oxide.

Tin oxide as the first conformal spacer material and silicon nitride as the second conformal spacer material can be used because even though silicon nitride is deposited at high temperatures, SnO can withstand such process conditions.

For example, in one example alternative embodiment, SnO is deposited as the second conformal spacer material while the first conformal spacer material is silicon nitride, titanium dioxide, hafnium oxide, amorphous silicon, or high temperature oxide. The selection of the two spacer materials are such that at least one of the conformal spacer materials includes SnO and the other of the conformal spacer materials includes material having an etch contrast to SnO, such as lead oxide, silicon nitride, titanium dioxide, hafnium oxide, amorphous silicon, or high temperature oxide. In some embodiments, hafnium oxide may not be used as the first conformal spacer material because hafnium oxide cannot be exhumed.

Where SnO is used as the second spacer, the deposition techniques described above with respect to operation 203 in FIG. 2 may be used.

Tin oxide as a second conformal spacer material is particularly useful for embodiments where the first conformal spacer material is exhumed using a wet chemistry, even if there are surface tension issues with using a liquid if other materials such as silicon-containing materials were used for the second conformal spacer material. For example, dilute hydrofluoric acid can be used to exhume silicon oxide. Since SnO is a robust material, if silicon oxide is used as the first conformal spacer material and dilute hydrofluoric acid is used to exhume silicon oxide selective to a SnO second conformal spacer material, SnO would have less of a risk of bending or buckling or having other distortion issues.

Certain disclosed embodiments are also particularly suitable for forming features that have very low line width roughness on the surfaces of the features. For example, the features may have a line width roughness of less than about 1.2 nm.

In some embodiments, etching of SnO as either the first conformal spacer material or the second conformal spacer material when the other of the first or second conformal spacer material also includes a Group IV element may also include passivating the substrate using a oxygen plasma flash operation to achieve sharp etching. An oxygen plasma flash operation forms silicon oxide which is a robust material compared to chlorine and then continue with chlorine overetch. If hydrogen chemistry is used directly to exhume the first conformal spacer material without a plasma flash operation when removing first conformal spacer material relative to specific silicon-containing types of second conformal spacer material (such as polysilicon), there is a risk of degradation on the second conformal spacer material. For robust silicon oxide, silicon nitride, or silicon carbide materials, a flash operation is not necessary to prevent etching of the second conformal spacer material when exhuming a first conformal spacer material.

Although spacer on spacer patterning is described herein, it will be understood that certain disclosed embodiments may be suitable for other applications where it is desirable to use an exhumable material and materials complementary to the exhumable materials to perform other patterning or processing schemes that involve deposition and etching.

Apparatus

Another aspect of the implementations disclosed herein is an apparatus and a system configured to accomplish the methods described herein. A suitable apparatus includes hardware for accomplishing the process operations and a system controller having instructions for controlling process operations in accordance with the disclosed implementations. In some embodiments, a deposition apparatus for depositing the SnO layer is provided. In some embodiments this is an ALD apparatus (e.g., a PEALD apparatus). In other embodiments it may be a CVD apparatus, or a sputtering apparatus that includes a SnO target. The apparatus includes a process chamber, a support for holding the substrate in place during the deposition, an inlet for flowing process gasses into the process chamber, and may also include a system for forming a plasma in the process chamber. Further, the apparatus includes a controller having program instructions for depositing the SnO layer, according to methods provided herein.

The dry etching operations provided herein can be performed in a variety of apparatuses that are equipped with delivery lines and control mechanisms configured for delivery of gaseous reagents. Examples of suitable process chambers include plasma etch chambers, RIE chambers, isotropic etch chambers, as well as resist strip chambers. In some embodiments the dry etch apparatus includes a process chamber housing a support for holding the substrate, and delivery lines for delivering one or more process gases to the process chamber. In some embodiments the apparatus further includes a system for generating a plasma in the process gas. The process chamber may further include a controller comprising program instructions for performing the etching. The instructions may include the instructions for delivery of the process gas, setting the temperature and pressure in the process chamber, and instructions on plasma parameters.

The wet etching operations provided herein can be performed in various apparatuses configured for delivering wet etchant onto a substrate. These may be configured for dipping the substrate in a liquid etchant, spraying or streaming the etchant onto the substrate or for other methods of contact. In some embodiments the apparatus includes a support for holding the substrate in place during etchant delivery, where the support may be configured for rotating the substrate, and one or more delivery ports (e.g., nozzles) configured to spray or stream the liquid etchant onto the substrate. The apparatus may further include a controller with program instructions for the wet etching process.

In another aspect, a system is provided, where the system includes a deposition chamber configured for depositing SnO layer, and one or more etching chambers (such as RIE chambers, wet etching chambers) configured for etching one or more materials on the substrate. The system further includes a controller having program instructions for depositing SnO layer and for forming SnO spacers according to methods disclosed herein.

PEALD apparatus will now be described as an example of an apparatus that is suitable for deposition of SnO layers, according to methods provided herein.

In some embodiments the conformal deposition of the SnO layer is conducted in a PEALD reactor which is a part of a Vector Excel deposition module available from Lam Research Corp. of Fremont, CA. A suitable process chamber includes a support for holding the wafer substrate during deposition (wafer pedestal), a generator for forming plasma in the process chamber, and conduits for delivering the components of the process gas (tin-containing precursor, oxygen-containing reactant, a carrier gas, etc.) to the process chamber. The apparatus is further configured for purging and/or evacuating the process chamber, and for maintaining a desired pressure and temperature in the process chamber during deposition.

Examples of PEALD process chambers are described in U.S. Pat. Nos. 6,416,822, 6,428,859, and 8,747,964 which are herein incorporated by reference in their entireties.

Figure 4:
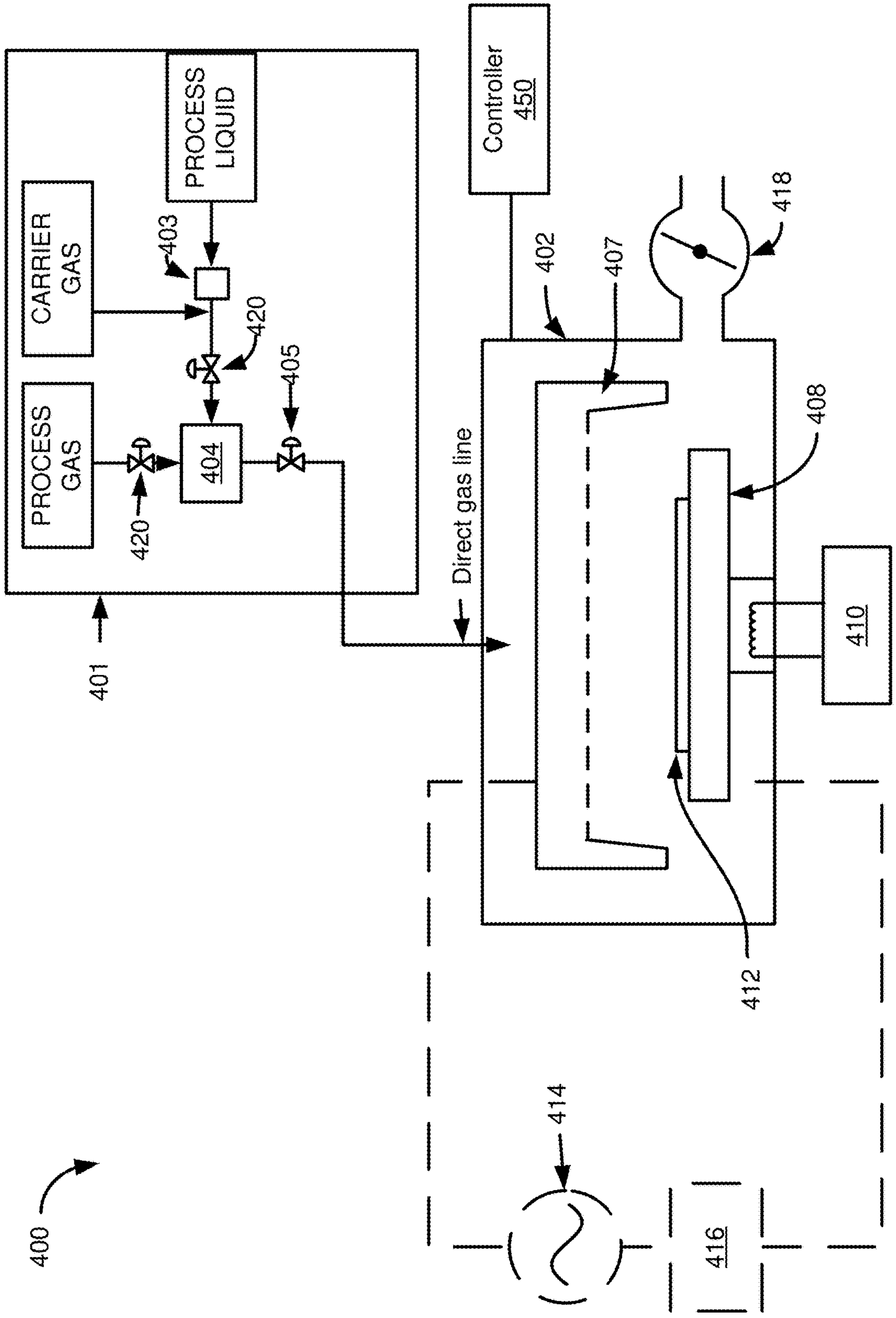
FIG. 4 is a schematic diagram of an example process chamber for performing certain disclosed embodiments.

FIG. 4 schematically shows an embodiment of a process station 400 that may be used to deposit provided SnO films. For simplicity, the process station 400 is depicted as a standalone process station having a process chamber body 402 for maintaining a low-pressure environment. However, it will be appreciated that a plurality of process stations 400 may be included in a common process tool environment. Further, it will be appreciated that, in some embodiments, one or more hardware parameters of process station 400, including those discussed in detail below, may be adjusted programmatically by one or more computer controllers.

Process station 400 fluidly communicates with reactant delivery system 401 for delivering process gases to a showerhead 406. Reactant delivery system 401 includes a mixing vessel 404 for blending and/or conditioning process gases for delivery to showerhead 406. One or more mixing vessel inlet valves 420 may control introduction of process gases to mixing vessel 404. Similarly, a showerhead inlet valve 405 may control introduction of process gasses to the showerhead 406.

Some reactants may be stored in liquid form prior to vaporization at and subsequent delivery to the process station. For example, the embodiment of FIG. 4 includes a vaporization point 403 for vaporizing liquid reactant to be supplied to mixing vessel 404. In some embodiments, vaporization point 403 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 403 may be heat traced. In some examples, mixing vessel 404 may also be heat traced. In one non-limiting example, piping downstream of vaporization point 403 has an increasing temperature profile extending from approximately 100° C. to approximately 150° C. at mixing vessel 404.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 403. In one scenario, a liquid injector may be mounted directly to mixing vessel 404. In another scenario, a liquid injector may be mounted directly to showerhead 406.

In some embodiments, a liquid flow controller upstream of vaporization point 403 may be provided for controlling a mass flow of liquid for vaporization and delivery to process station 400. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 406 distributes process gases toward substrate 412. In the embodiment shown in FIG. 4, substrate 412 is located beneath showerhead 406, and is shown resting on a pedestal 408. It will be appreciated that showerhead 406 may have any suitable shape, and may have any suitable number and arrangement of ports for distributing processes gases to substrate 412.

In some embodiments, a microvolume 407 is located beneath showerhead 406. Performing an ALD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 408 may be raised or lowered to expose substrate 412 to microvolume 407 and/or to vary a volume of microvolume 407. For example, in a substrate transfer phase, pedestal 408 may be lowered to allow substrate 412 to be loaded onto pedestal 408. During a deposition process phase, pedestal 408 may be raised to position substrate 412 within microvolume 407. In some embodiments, microvolume 407 may completely enclose substrate 412 as well as a portion of pedestal 408 to create a region of high flow impedance during a deposition process.

Optionally, pedestal 408 may be lowered and/or raised during portions the deposition process to modulate process pressure, reactant concentration, etc., within microvolume 407. In one scenario where process chamber body 402 remains at a base pressure during the deposition process, lowering pedestal 408 may allow microvolume 407 to be evacuated. Example ratios of microvolume to process chamber volume include, but are not limited to, volume ratios between 1:900 and 1:10. It will be appreciated that, in some embodiments, pedestal height may be adjusted programmatically by a suitable computer controller.

In another scenario, adjusting a height of pedestal 408 may allow a plasma density to be varied during plasma activation and/or treatment cycles included in the deposition process. At the conclusion of the deposition process phase, pedestal 408 may be lowered during another substrate transfer phase to allow removal of substrate 412 from pedestal 408.

While the example microvolume variations described herein refer to a height-adjustable pedestal, it will be appreciated that, in some embodiments, a position of showerhead 406 may be adjusted relative to pedestal 408 to vary a volume of microvolume 407. Further, it will be appreciated that a vertical position of pedestal 408 and/or showerhead 406 may be varied by any suitable mechanism within the scope of the present disclosure. In some embodiments, pedestal 408 may include a rotational axis for rotating an orientation of substrate 412. It will be appreciated that, in some embodiments, one or more of these example adjustments may be performed programmatically by one or more suitable computer controllers.

Returning to the embodiment shown in FIG. 4, showerhead 406 and pedestal 408 electrically communicate with RF power supply 414 and matching network 416 for powering a plasma. In some embodiments, the plasma energy may be controlled by controlling one or more of a process station pressure, a gas concentration, an RF source power, an RF source frequency, and a plasma power pulse timing. For example, RF power supply 414 and matching network 416 may be operated at any suitable power to form a plasma having a desired composition of radical species. Examples of suitable powers are included above. Likewise, RF power supply 414 may provide RF power of any suitable frequency. In some embodiments, RF power supply 414 may be configured to control high- and low-frequency RF power sources independently of one another. Example low-frequency RF frequencies may include, but are not limited to, frequencies between 50 kHz and 900 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of the process gas and/or its individual components, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some embodiments, pedestal 408 may be temperature controlled via heater 410. Further, in some embodiments, pressure control for process station 400 may be provided by butterfly valve 418. As shown in the embodiment of FIG. 4, butterfly valve 418 throttles a vacuum provided by a downstream vacuum pump (not shown). However, in some embodiments, pressure control of process station 400 may also be adjusted by varying a flow rate of one or more gases introduced to process station 400.

Process station 400 also includes controller 450 which may be programmed to perform functions for operating certain disclosed embodiments. Controller 450 may have one or more features that are further described below with respect to system controller 550 of FIG. 5 or controller 629 of FIG. 6. In some embodiments, controller 629 or system controller 550 include controller 450.

Figure 5:
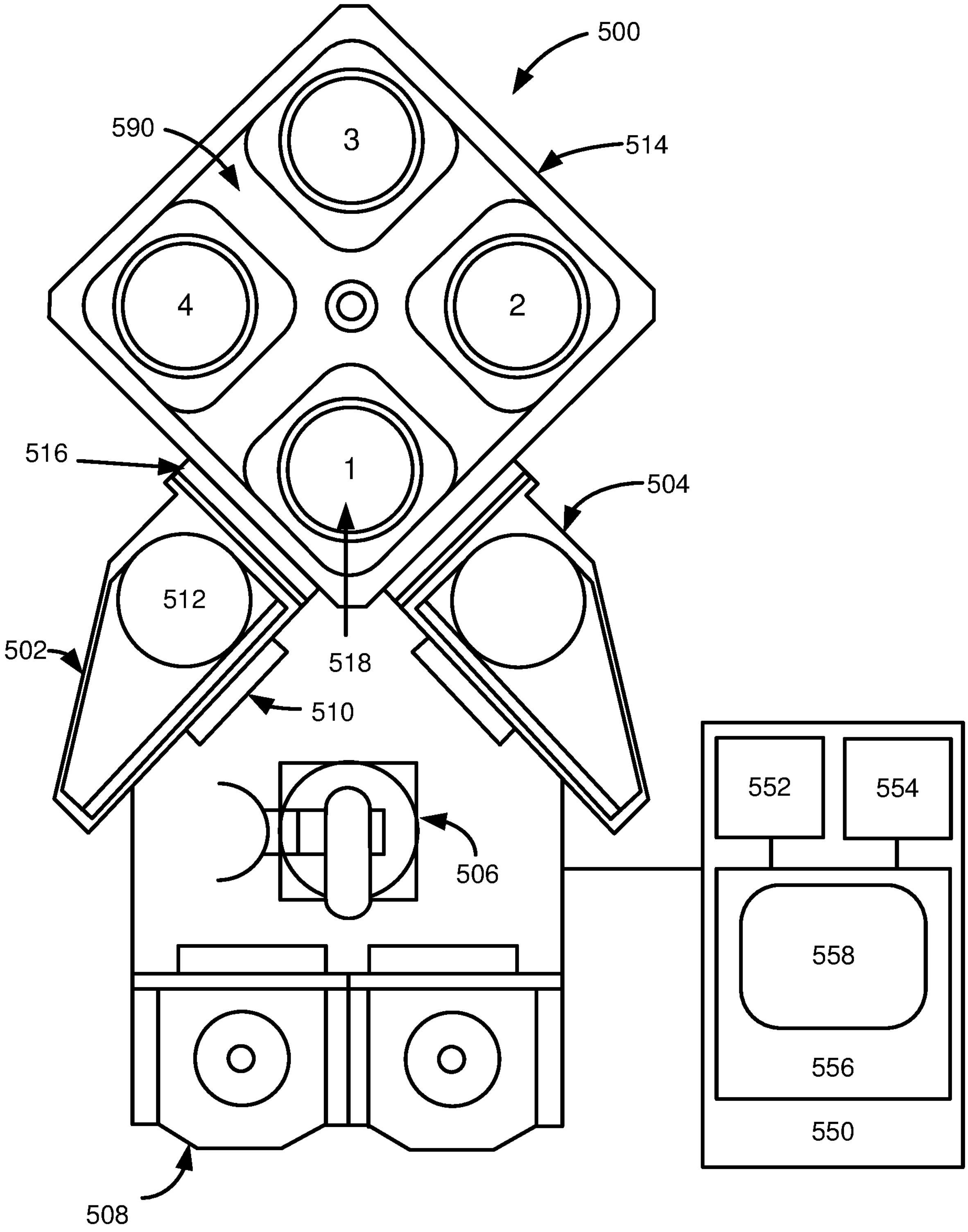
FIGS. 5 and 6 are schematic diagrams of example process tools for performing certain disclosed embodiments.

In some embodiments, the substrates provided herein are processed in a multi-station tool. FIG. 5 shows a schematic view of an embodiment of a multi-station processing tool 500 with an inbound load lock 502 and an outbound load lock 504, either or both of which may comprise a remote plasma source. A robot 506, at atmospheric pressure, is configured to move wafers from a cassette loaded through a pod 508 into inbound load lock 502 via an atmospheric port 510. A wafer is placed by the robot 506 on a pedestal 512 in the inbound load lock 502, the atmospheric port 510 is closed, and the load lock is pumped down. Where the inbound load lock 502 comprises a remote plasma source, the wafer may be exposed to a remote plasma treatment in the load lock prior to being introduced into a processing chamber 514. Further, the wafer also may be heated in the inbound load lock 502 as well, for example, to remove moisture and adsorbed gases. Next, a chamber transport port 516 to processing chamber 514 is opened, and another robot (not shown) places the wafer into the reactor on a pedestal of a first station shown in the reactor for processing.

The depicted processing chamber 514 comprises four process stations, numbered from 1 to 4 in the embodiment shown in FIG. 5. Each station has a heated pedestal (shown at 518 for station 1), and gas line inlets. It will be appreciated that in some embodiments, each process station may have different or multiple purposes. While the depicted processing chamber 514 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 5 also depicts an embodiment of a wafer handling system 590 for transferring wafers within processing chamber 514. In some embodiments, wafer handling system 590 may transfer wafers between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of multi-station processing tool 500. System controller 550 may include one or more memory devices 556, one or more mass storage devices 554, and one or more processors 552. Processor 552 may include a CPU or computer, analog and/or digital input/output connections, stepper motor controller boards, etc.

In some embodiments, system controller 550 controls all of the activities of multi-station processing tool 500. System controller 550 executes system control software 558 stored in mass storage device 554, loaded into memory device 556, and executed on processor 552. System control software 558 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by multi-station processing tool 500. System control software 558 may be configured in any suitable way. For example, various process tool component subroutines or control objects may be written to control operation of the process tool components necessary to carry out various process tool processes in accordance with the disclosed methods. System control software 558 may be coded in any suitable computer readable programming language.

In some embodiments, system control software 558 may include input/output control (IOC) sequencing instructions for controlling the various parameters described above. For example, each phase of a PEALD process may include one or more instructions for execution by system controller 550.

Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 518 and to control the spacing between the substrate and other parts of multi-station processing tool 500.

A process gas control program may include code for controlling gas composition and flow rates and optionally for flowing gas into one or more process stations prior to deposition in order to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 550 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of multi-station processing tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Any suitable chamber may be used to implement the disclosed embodiments. Example deposition apparatuses include, but are not limited to, apparatus from the ALTUS® product family, the VECTOR® product family, and/or the SPEED® product family, each available from Lam Research Corp., of Fremont, California, or any of a variety of other commercially available processing systems. Two or more of the stations may perform the same functions. Similarly, two or more stations may perform different functions. Each station can be designed/configured to perform a particular function/method as desired.

Figure 6:
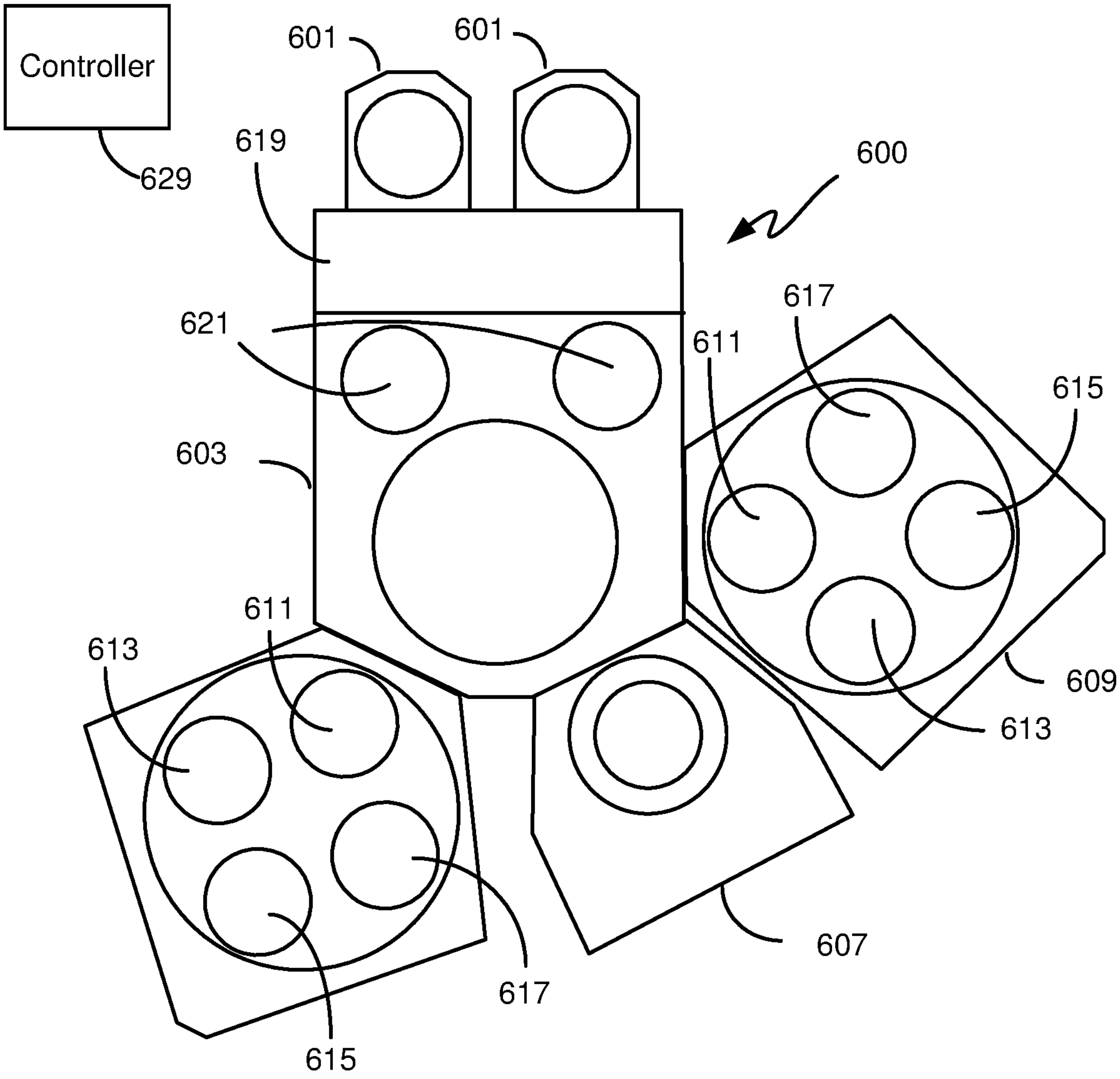

FIG. 6 is a block diagram of a processing system suitable for conducting thin film deposition process in accordance with certain embodiments. The system 600 includes a transfer module 603. The transfer module 603 provides a clean, pressurized environment to minimize risk of contamination of substrates being processed as they are moved between various reactor modules. Mounted on the transfer module 603 are two multi-station reactors 609 and 610, each capable of performing atomic layer deposition (ALD) and/or chemical vapor deposition (CVD) according to certain embodiments. In other embodiments one reactor may contain stations configured to perform ALD and another reactor may include stations configured to perform etching. Multi-station reactors 609 and 610 may include multiple stations 611, 613, 615, and 617 that may sequentially or non-sequentially perform operations in accordance with disclosed embodiments. The stations may include a heated pedestal or substrate support, one or more gas inlets or showerhead or dispersion plate.

Also mounted on the transfer module 603 may be one or more single or multi-station modules 607 capable of performing plasma or chemical (non-plasma) pre-cleans, or any other processes described in relation to the disclosed methods. The multi-station module 607 may in some cases be used for various treatments to, for example, prepare a substrate for a deposition process. The multi-station module 607 may also be designed/configured to perform various other processes such as etching or polishing. The system 600 also includes one or more wafer source modules 601, where wafers are stored before and after processing. An atmospheric robot (not shown) in the atmospheric transfer chamber 619 may first remove wafers from the wafer source modules 601 to loadlocks 621. A wafer transfer device (generally a robot arm unit) in the transfer module 603 moves the wafers from loadlocks 621 to and among the modules mounted on the transfer module 603.

In various embodiments, a controller 629 is employed to control process conditions during deposition. The controller 629 will typically include one or more memory devices and one or more processors. A processor may include a CPU or computer, analog and/or digital input/output connections, stepper motor controller boards, etc.

The controller 629 may control all of the activities of the deposition apparatus. The controller 629 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 629 may be employed in some embodiments.

Typically there will be a user interface associated with the controller 629. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the controller 629. The signals for controlling the process are output on the analog and digital output connections of the system 600.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller 629 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 629, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus and processes described herein may be used in conjunction with lithographic patterning tools or processes, for example, for the fabrication or manufacture of semiconductor devices, displays, LEDs, photovoltaic panels, and the like. Typically, though not necessarily, such apparatus and processes will be used or conducted together in a common fabrication facility. Lithographic patterning of a film typically comprises some or all of the following steps, each step enabled with a number of possible tools: (1) application of photoresist on a work piece, i.e., a substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method for processing substrate, the method comprising:

performing spacer-on-spacer patterning on a semiconductor substrate using at least one spacer comprising tin oxide, wherein performing spacer-on-spacer patterning comprises:

forming a first spacer comprising a first conformal spacer material by selectively etching a patterned core material from a substrate having the first conformal spacer material over the patterned core material, the first conformal spacer material selected from the group consisting of titanium oxide, silicon oxide, silicon nitride, and lead oxide over the patterned core material; and forming a second spacer comprising a second conformal spacer material using the first spacer, the second conformal spacer material comprising tin.

2. The method of claim 1, wherein performing spacer-on-spacer patterning comprises:

depositing a first conformal spacer material over a patterned core material, selectively etching the patterned core material to form a first spacer comprising the first conformal spacer material, depositing a second conformal spacer material over the first spacer, selectively etching the first spacer to form a second spacer comprising the second conformal spacer material, and etching a target layer using the second spacer as a mask, wherein either the first conformal spacer material comprises tin oxide or the second conformal spacer material comprises tin oxide.

3. The method of claim 2, wherein the first conformal spacer material comprises tin oxide and the first spacer is selectively etched by exhuming using hydrogen gas.

4. The method of claim 2, wherein at least one of the first conformal spacer material and the second conformal spacer material comprises tin oxide and the other of the first conformal spacer material and the second conformal spacer material is selected from the group consisting of titanium oxide, silicon oxide, silicon nitride, hafnium oxide, and lead oxide.

5. The method of claim 2, wherein the first conformal spacer material comprises tin oxide and the first spacer is selectively etched by exhuming using hydrogen gas.

6. The method of claim 1, wherein the tin oxide is deposited using a tin halide, organometallic tin-containing compound, chlorinated organometallic tin-containing compound, and combinations thereof.

7. The method of claim 1, wherein the tin oxide is deposited using a tin-containing precursor selected from the group consisting of tetrakis(dimethylamino) tin; tetrakis (ethylmethylamino) tin; $N^2$,$N^3$-di-tert-butyl-butane-2,3-diamino-tin(II); and 1,3-bis(1,1-dimethylethyl)-4,5-dimethyl-(4R,5R)-1,3,2-diazastannolidin-2-ylidine.

8. The method of claim 1, wherein the tin oxide is deposited using a tin-containing precursor selected from the group consisting of to tetrakis(dimethylamino) tin; tetrakis (ethylmethylamino) tin; $N^2$,$N^3$-di-tert-butyl-butane-2,3-diamino-tin(II); 1,3-bis(1,1-dimethylethyl)-4,5-dimethyl-(4R, 5R)-1,3,2-diazastannolidin-2-ylidine; stannous fluoride ($SnF_2$); tin(IV) chloride ($SnCl_4$); tin(IV) bromide ($SnBr_4$); tin hydride ($SnH_4$); tin(II)(1,3-bis(1,1-dimethylethyl)-4,5-dimethyl-(4R,5R)-1,3,2-diazastannolidin-2-ylidene); tetraethyl tin ($SnEt_4$); tetramethyl tin ($SnMe_4$); dibutyltin diacetate ($Bu_2Sn(OAc)_2$);

(dimethylamino)trimethyl tin(IV) ($Me_3Sn(NMe_2)$); tetrakis(diethylamido)tin(IV) ($Sn(NEt_2)_4$), trimethyl tin chloride; dimethyl tin dichloride; methyl tin trichloride;

bis[bis(trimethylsilyl)amino]tin(II); hexaphenylditin(IV); tin(II) acetylacetonate;

trimethyl(phenylethynyl) tin; dibutyldiphenyltin; tetraallyltin; tetravinyltin; and tricyclohexyltin hydride.

9. The method of claim 1, wherein the tin oxide is provided using at least one of chemical vapor deposition process, atomic layer deposition, or any combination thereof.

10. The method of claim 1, wherein tin oxide is provided using plasma-enhanced atomic layer deposition (PEALD).

11. The method of claim 1, wherein the tin oxide is deposited using an oxygen-containing reactant selected from the group consisting of oxygen gas, oxygen plasma, water, ozone, hydrogen peroxide, and nitrous oxide.

12. A method for processing substrates, the method comprising:

providing a substrate having a patterned core material;

depositing a first material conformally over the patterned core material on sidewalls of the patterned core material, the first material selected from the group consisting of silicon oxide, silicon nitride, titanium oxide, and lead oxide;

selectively removing the patterned core material to form a first spacer;

depositing spacer material comprising a tin oxide conformally over the first spacer on sidewalls of the first spacer; and selectively removing first spacers to form second spacers comprising the tin oxide.

13. The method of claim 12, wherein the tin oxide spacer material is deposited using a tin-containing precursor selected from the group consisting of tetrakis(dimethylamino) tin; tetrakis(ethylmethylamino) tin; $N^2$,$N^3$-di-tert-butyl-butane-2,3-diamino-tin(II); 1,3-bis(1,1-dimethylethyl)-4,5-dimethyl-(4R,5R)-1,3,2-diazastannolidin-2-ylidine; stannous fluoride ($SnF_2$); tin(IV) chloride ($SnCl_4$); tin(IV) bromide ($SnBr_4$); tin hydride ($SnH_4$); tin(II)(1,3-bis (1,1-dimethylethyl)-4,5-dimethyl-(4R,5R)-1,3,2-diazastannolidin-2-ylidene); tetraethyl tin ($SnEt_4$); tetramethyl tin ($SnMe_4$); dibutyltin diacetate ($Bu_2Sn(OAc)_2$); (dimethylamino)trimethyl tin(IV) ($Me_3Sn(NMe_2)$);

tetrakis(diethylamido)tin(IV) ($Sn(NEt_2)_4$), trimethyl tin chloride; dimethyl tin dichloride;

methyl tin trichloride; bis[bis(trimethylsilyl)amino]tin (II); hexaphenylditin(IV); tin(II) acetylacetonate; trimethyl(phenylethynyl) tin; dibutyldiphenyltin; tetraallyltin; tetravinyltin;

and tricyclohexyltin hydride.

14. The method of claim 12, wherein the tin oxide spacer material is deposited using an oxygen-containing reactant selected from the group consisting of oxygen gas, oxygen plasma, water, ozone, hydrogen peroxide, and nitrous oxide.

15. A method for processing substrates, the method comprising:

depositing an exhumable material conformally over a core material;

selectively removing horizontal regions of the exhumable material and removing the core material to form spacers comprising the exhumable material; and depositing a complementary material over the spacers comprising the exhumable material, wherein the exhumable material is capable of being selectively etched relative to the complementary material, wherein the exhumable material comprises tin oxide and the complementary material is selected from the group consisting of titanium oxide, silicon oxide, silicon nitride, hafnium oxide, and lead oxide.

16. The method of claim 15, wherein at least one of the exhumable material and the complementary material comprises tin oxide and the other of the exhumable material and the complementary material is selected from the group consisting of titanium oxide, silicon oxide, silicon nitride, hafnium oxide, and lead oxide.

17. The method of claim 15, further comprising removing the spacers comprising the exhumable material using hydrogen gas.

18. The method of claim 15, wherein the exhumable material is selected from the group consisting of titanium oxide, silicon oxide, silicon nitride, and lead oxide and the complementary material comprises tin oxide.

19. The method of claim 15, wherein the exhumable material comprises tin oxide deposited using a tin-containing precursor selected from the group consisting of tetrakis (dimethylamino) tin; tetrakis(ethylmethylamino) tin; $N^2$,$N^3$-di-tert-butyl-butane-2,3-diamino-tin(II); 1,3-bis(1,1-dimethylethyl)-4,5-dimethyl-(4R,5R)-1,3,2- diazastannolidin-2-ylidine; stannous fluoride ($SnF_2$); tin(IV) chloride ($SnCl_4$); tin(IV) bromide ($SnBr_4$); tin hydride ($SnH_4$); tin(II)(1,3-bis(1,1-dimethylethyl)-4,5-dimethyl-(4R,5R)-1,3,2-diazastannolidin-2-ylidene); tetraethyl tin ($SnEt_4$); tetramethyl tin ($SnMe_4$); dibutyltin diacetate ($Bu_2Sn(OAc)_2$); (dimethylamino)trimethyl tin(IV) ($Me_3Sn(NMe_2)$);

tetrakis(diethylamido)tin(IV) ($Sn(NEt_2)_4$), trimethyl tin chloride; dimethyl tin dichloride;

methyl tin trichloride; bis[bis(trimethylsilyl)amino]tin(II); hexaphenylditin(IV); tin(II) acetylacetonate; trimethyl(phenylethynyl) tin; dibutyldiphenyltin; tetraallyltin; tetravinyltin;

and tricyclohexyltin hydride.

* * * * *